United States Patent [19]

Hori

[11] Patent Number: 5,604,357
[45] Date of Patent: Feb. 18, 1997

[54] SEMICONDUCTOR NONVOLATILE MEMORY WITH RESONANCE TUNNELING

[75] Inventor: Takashi Hori, Osaka, Japan

[73] Assignee: Matsushita Electric Industrial Co., Ltd., Osaka, Japan

[21] Appl. No.: 500,826

[22] Filed: Jul. 11, 1995

[30] Foreign Application Priority Data

Jul. 12, 1994 [JP] Japan .................... 6-160269

[51] Int. Cl.⁶ .................................. H01L 29/06
[52] U.S. Cl. ................ 257/24; 257/25; 257/68; 257/321; 257/324; 257/410; 257/411
[58] Field of Search .................. 257/16, 17, 19, 257/20, 22, 24, 25, 68, 300, 324, 325, 326, 406, 410, 411, 321

[56] References Cited

U.S. PATENT DOCUMENTS 5,319,229  6/1994  Shimoji et al. .............. 257/324

FOREIGN PATENT DOCUMENTS 4-97564  3/1992  Japan .................. 257/25

*Primary Examiner*—Minhloan Tran
*Attorney, Agent, or Firm*—McDermott, Will & Emery

[57] ABSTRACT

A semiconductor device comprising a substrate having thereon a capacitance part and an electrode, the capacitance part having two storage regions for conductive carriers, the storage regions having therebetween a first barrier region of a multi-tunneling structure, a second barrier region being provided among the storage region, semiconductor substrate and electrode, the first barrier region comprising two tunneling barriers and a low barrier region interposed therebetween, so that when the conductive carriers are moved between the storage regions to store memory by use of polarization characteristic, high voltage makes higher probability of conductive carrier shift and low voltage lower probability of the carrier shift in synergistic manner, whereby the semiconductor device having merits of writing, erasing and reading characteristic in DRAMs and flash EEPROMs memories.

24 Claims, 25 Drawing Sheets

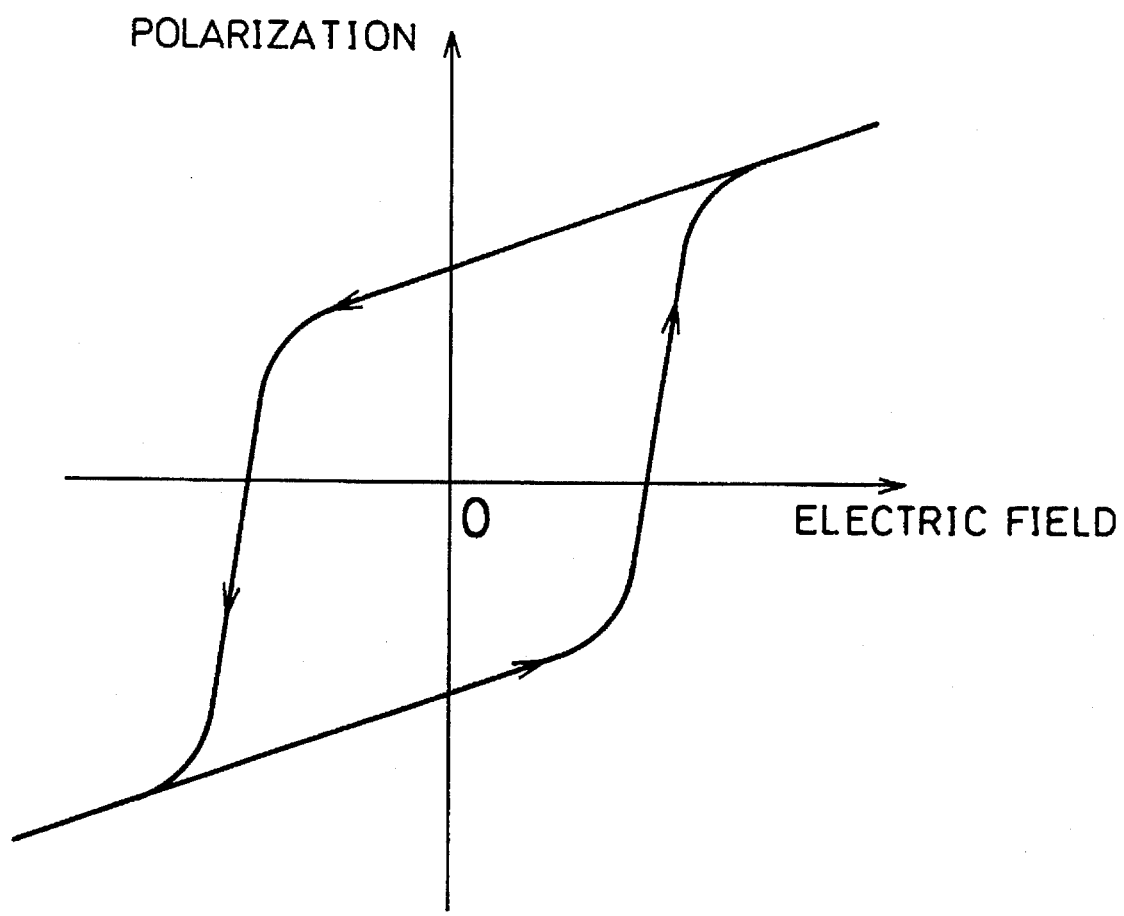

Fig.4
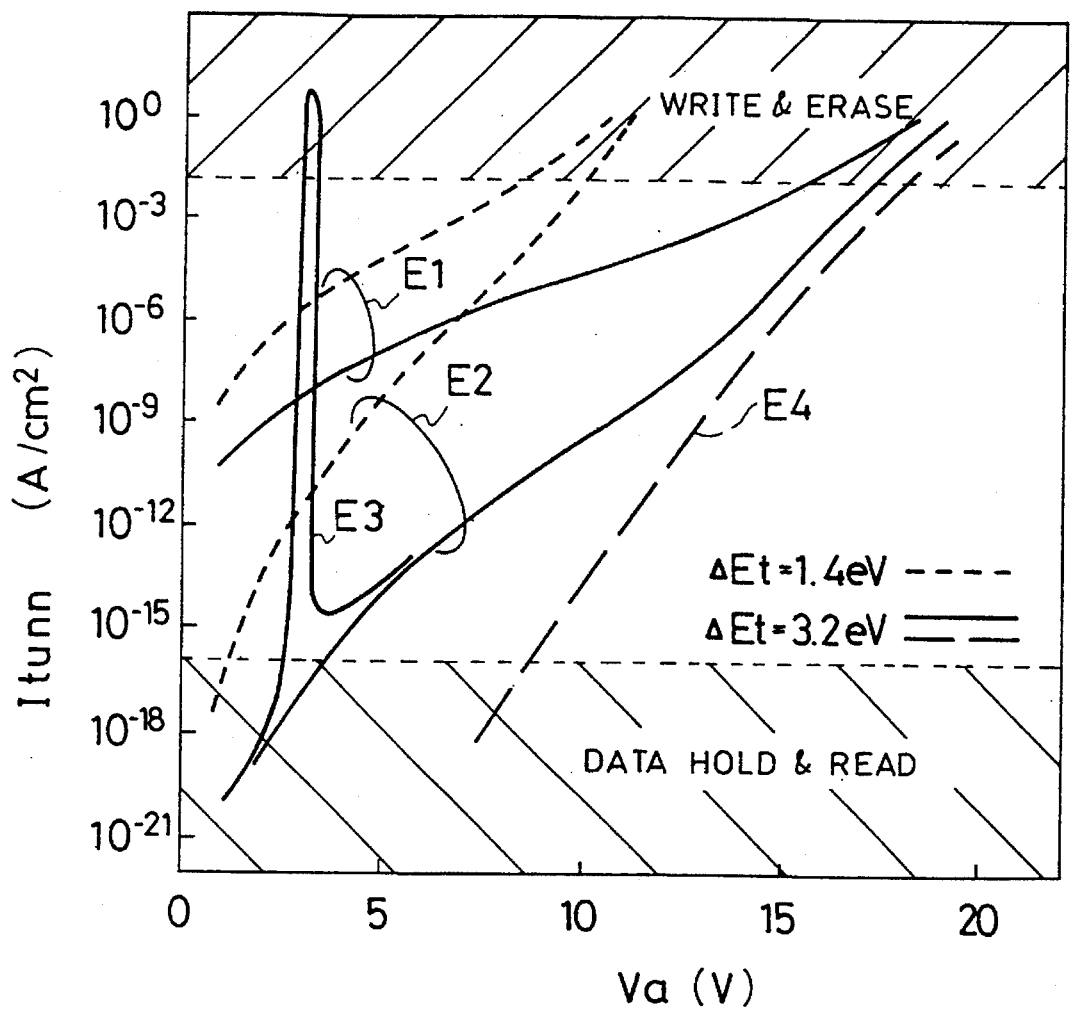
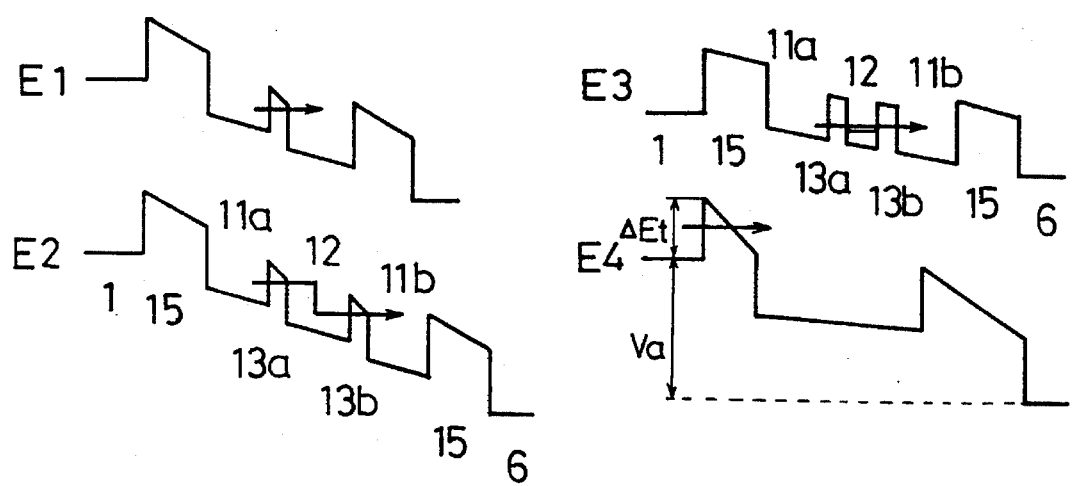

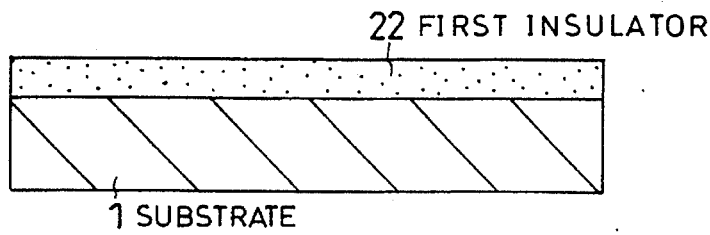
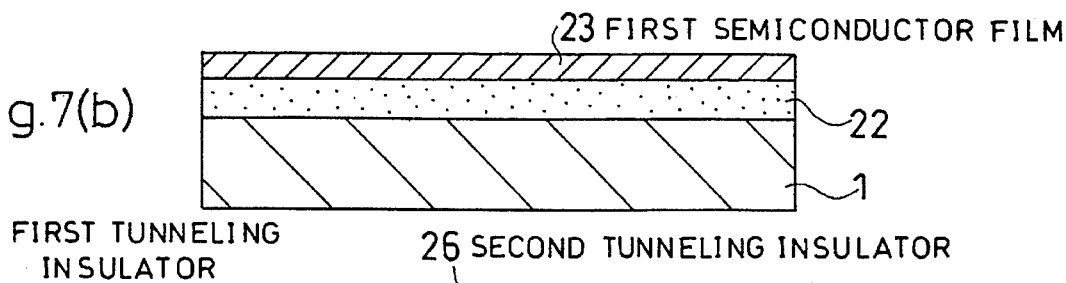
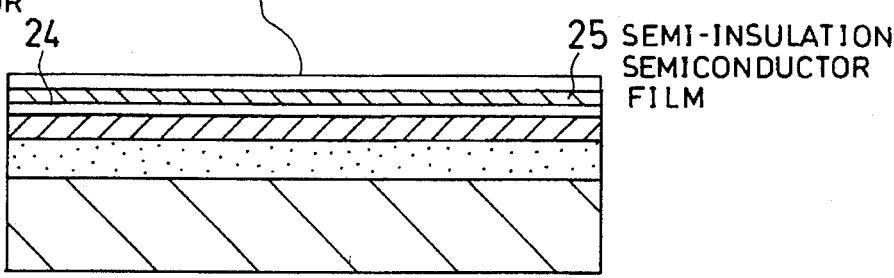
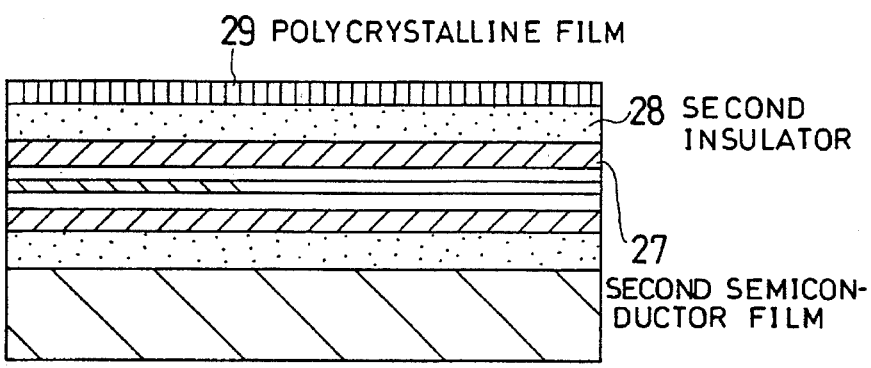
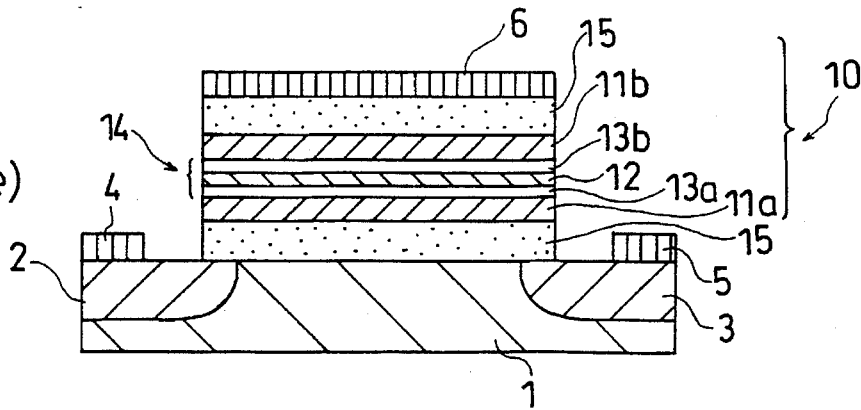

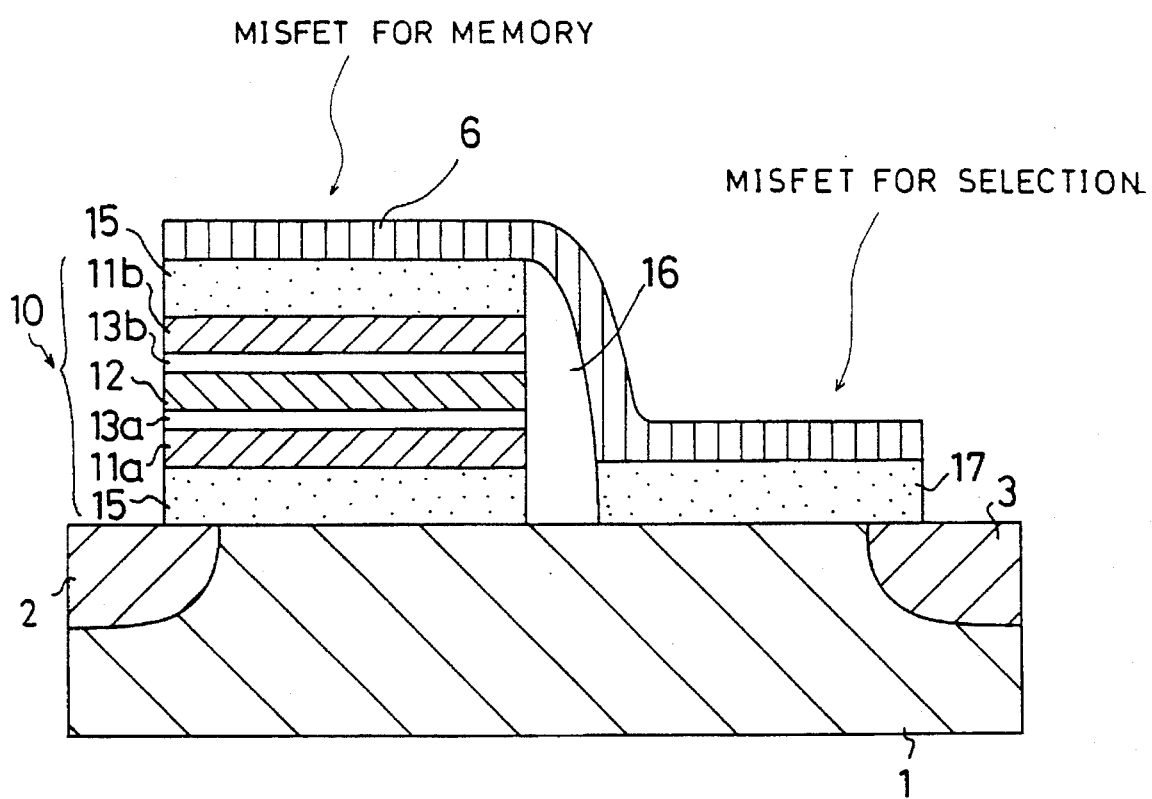

QUANTUM LEVEL OF ENERGY GAP $\Delta E_0$

DISTRIBUTION OF ELECTRONS

DISTRIBUTION OF ELECTRONS

QUANTUM LEVEL OF ENERGY GAP $\Delta E_0$

DISTRIBUTION OF ELECTRONS

DISTRIBUTION OF ELECTRONS

SEMICONDUCTOR NONVOLATILE MEMORY WITH RESONANCE TUNNELING

BACKGROUND OF THE INVENTION

The present invention relates to a semiconductor device having function storing information and a manufacturing method of the semiconductor device, particularly to improvement of such functions as re-writing, reading and storing information in the semiconductor device.

DRAM (Dynamic Random Access Memory) is a memory device comprising a semiconductor for storing information and has been hitherto widely used. Storage elements (memory cells) forming DRAM each typically comprises a storage capacitance and a switching MOS (Metal-Oxide-Semiconductor) FET, so that reading stored data is performed by taking out in the form of digital signals "0" or "1" through bit lines a specific voltage corresponding to a state of charges accumulated in the storage capacitance of a selected memory cell. The stored data in DRAM disappears instantly when a power supply is stopped, i.e., the stored data is volatile. The stored data of DRAM is read out "destructively" to then be no longer exist in the device, whereby necessitating refreshing of data (writing again the data read out).

Flash-EEPROMs (Electrically Erasable Programmable Read Only Memories) is a nonvolatile memory characterized in that data stored in the device is kept alive even when a power supply is stopped. Each memory cell of flash-EEPROMs comprises a MOSFET having a so-called stacked gate structure including a control gate electrode, a semiconductor substrate and a floating-gate electrode provided therebetween. Data storage is performed by use of a change of threshold in MOSFETs corresponding to specific amounts of charges accumulated in the floating gate. Writing data is carried out by feeding charges (electrons generally) from the semiconductor substrate into the floating gate, using that hot carrier generated by applying high voltage to drain regions gets over an energy barrier formed with gate oxide, or that gate oxide is applied with a high electrical field to allow F-N (Fowler-Nordheim) tunneling current to flow. Erasing data is performed by applying to the gate oxide a high electrical field in the opposite direction to the above so as to draw charges from the floating gate to the semiconductor substrate through the F-N tunneling. The flash EEPROM does not require refreshing of data as in DRAMs but it takes longer time to write and erase data largely differently than DRAMs.

Another nonvolatile memory is NV-DRAM (Non-Volatile DRAMs) whose memory cells each typically comprises a MFS (Metal-Ferrodielectric-Semiconductor) FET using a ferroelectric substance as gate insulator, wherein ionic polarization in the ferroelectrics is changed corresponding to orientation of application of electrical field so as to change threshold of the MFSFET, thereby storing data. Japanese Unexamined Patent Application No. 4-97564(1992) discloses another type of NV-DRAM, i.e, a semiconductor device using "electronic dipole" polarization in place of the ionic polarization in ferroelectrics above wherein as shown in FIGS. 24 and 25 a plurality of active regions provided among the insulator barriers each corresponds to the respective crystal lattice made of the ferroelectrics and an applied electrical field allows conductive carriers to pass to and from through the tunneling barriers (formed in the active regions) and be localized, thereby storing data. The NV-DRAMs are essentially nonvolatile due to a memorizing function by polarization but require data to be read "destructively" similarly to DRAMs as foregoing, necessitating refreshing of data when read.

Generally, an ideal semiconductor memory applicable to electronic equipments in the future needing high speed operation, low power consumption, portability and compactness is a combination of merits of DRAMs and flash EEPROMs and should satisfy the following requirements.

(a) Writing and erasing as well as reading are performed at a high speed as several hundred nsec. or lower, which is the merit of DRAMs but not of flash EEPROMs.

(b) The memory has the maximum number of writing to enable continuous writing of data for 10 years (general life expectancy in industries), which is the merit of DRAMs but not of flash EEPROMs.

(c) Data once stored is held without power supply for 10 years in an electric field which is generated internally in the device when a carrier exists at a position, and orientation of the electric field tends to cause the carrier to flow away from the position, which is the merit of flash EEPROMs but not of DRAMs.

(d) The device has no "destructive" data reading, i.e., no necessity of refreshing data whenever read for the purpose of low power consumption, which is the merit of flash EEPROMs but not of DRAMs.

Nonvolatile memories developed in recent years use MIS type semiconductors having gate insulator about 10 nm thick and employs a data storing system using existence/non-existence of carriers in the order at least of $10^{12}$/cm2 in the insulator regions. Transfer of carriers is performed generally by tunneling barriers provided in the insulator regions. Assuming the current in this instance is Itunn, the foregoing requirements (a) to (d) are referred to more concretely as follows.

(A) Writing and erasing need high current Itunn about 1A/cm2, and applied voltage (so-called writing voltage) is preferably about ±20 V or less for the purpose of low power consumption and in view of specific design of integrated circuits.

(B) It is required to enable re-writing data more than at least $10^{16}$ times (the number 2 or 3 figures lower is acceptable, for example, $10^{14}$, in case of no "destructive" reading).

(C) In holding data, the current Itunn should be very much low to be about $10^{16}$A/cm2 or less within the voltage range of at least ±0.5 V to ±1 V corresponding to the electric field generated in existence of carriers.

(D) To eliminate the "destructive" reading, a practical working voltage range for reading is preferably at least ±1 V to ±2 V (this feature is incidental to the item (C) since other features than the working voltage range are the same as of the item (C)).

As seen from the above, the ideal tunneling barriers should satisfy the strict requirements that resistance is variable over about 15 figures and the barrier has high resistance equal to insulators in a low electric field. The conventional art does provide neither any semiconductor memories which could satisfy all the above requirements nor nonvolatile semiconductor memories satisfying only the above requirement (A) or those (B) and (C). DRAMs which concern the "destructive" reading need to have refreshing data whenever read. Additionally, charges accumulated in the storage capacitances leak gradually to be lost, so that DRAMs require to have periodically refreshing data, even when not read at all, at a predetermined time interval (the so-called refreshing time every 1 msec to 100 msec). Hence, DRAMs have the defects that stored data is volatile and the device needs large power consumption.

Flash EEPROMs hold data even when power supply is stopped, not necessitating the data-refreshing operation. The semiconductor device however requires to be applied internally, particularly at the gate oxide, with a quite large electric field (10 MV/cm2 or more, generally, near the maximum dielectric breakdown field of silicon oxide). Hence, flash EEPROMs are hard to achieve reliability and are limited in the feasible re-writing number to $10^4$ to $10^5$ at the maximum. Additionally, electric field and current applied upon writing and erasing data have certain upper limits in relation to the insufficient reliability, resulting in that time required for writing and erasing data is quite longer (several 10 μsec and several 10 msec typically for writing and erasing, respectively) widely different from several 10 nsec as of DRAMs.

Furthermore, flash EEPROMs use the stacked gate structure, necessitating higher writing and erasing voltages corresponding to the coupling ratio of specific capacitances. Stacked gate type flash EEPROMs including gate oxide 8 nm thick having E4 type energy level properties, as exemplified in FIG. 4, require to be applied with high voltage about 15 to 20 V for writing and erasing data. Hence, the device when used as an IC memory element requires an additional generator circuit for the above high voltage and an extra power consumption to the extent of higher voltage. Also, a typical data-writing system using hot carriers has such defect of further larger power consumption for writing data due to low feeding efficiency of hot carriers into the floating gate.

MFSFETs, the typical NV-DRAM, has the problems in the material itself of ferroelectrics and has not yet been put into practical use. The ferroelectrics when used in MFSFET is required to be thinner to several 100 nm or less, so that the ionic polarization becomes quite small insufficient for practical use; a stable and favorable interface with the semiconductor sufficient for practical use as FETs is hard to obtain; specific processes before and after the film formation process are restricted in various conditions by the ferroelectric materials having high reactivity; and there additionally occurs the problem of the so-called film fatigue that the ionic polarization lowers following the specific numbers of writing data (the maximum number of writing more or less $10^{10}$ times typically), and dielectric breakdown in the film.

The semiconductor device disclosed in the Japanese Unexamined Patent Application No. 4-97564(1992) provides, as shown in FIG. 22 and 28 and in the claims, in the insulator barriers a plurality of active regions each corresponding to the respective crystalline lattice made of the ferroelectrics, and in each active region a tunneling barrier. Due to the latter feature, this device does however not satisfy the foregoing requirements for the ideal semiconductor memory. The energy level properties of E1 type shown in FIG. 4 explains the case using the structure shown in the Japanese publication and a most simple feature having only one active region, wherein the peripheral barrier regions sandwitching the active region are 6 nm thick to prevent conductive carriers existing therein from leaking to the outside through a direct tunneling, and a tunneling barrier 3 nm thick causing the direct tunneling uses energy barriers ΔEt of 1.4 eV and 3.2 eV. It will be appreciated from the drawing that even with the energy barrier 3.2 eV rather higher among the practical barriers, the current Itunn in the low voltage range upon data hold is extremely high, resulting in that the device is quite hard to satisfy both the requirements (C) and (D). Using the lower barrier 1.4 eV further increases the current Itunn in the low voltage range upon data hold. In the low voltage range a current from the direct tunneling is dominant, while in the range of $10^{-2}$ A/cm2 or more for high speed writing the tunneling barrier film is applied with a high electric field near 10 MV/cm to allow a F-N tunneling current component is rather dominant. That is, it is seen from the drawing that even with a thin tunneling barrier causing the direct tunneling the tunneling barrier is applied with a high electric field substantially equal to that of the flash EEPROM upon the high speed writing. Hence, the semiconductor device disclosed in the Japanese publication is hard also to satisfy the requirement (B) since the maximum number of writing is substantially limited as in the flash EEPROMs. The substantially same conclusion should be obtained with different values of the tunneling barrier thickness, energy barrier ΔEt and the peripheral barrier regions thickness from those referred to in the above example. Also, provision of a plurality of active regions other than the single active region as above should deduce the same conclusion. In brief, the semiconductor device shown in the Japanese publication does not satisfy at least the requirement (A), similarly the requirement (B), and further both of those (C) and (D) at a time. Additionally, the semiconductor device utilizes the polarization effect with "electric dipole" as shown in FIGS. 22 and 23 and in the claims. Thus, the active regions in the insulator barrier should be plural. In case that thickness of the barrier regions, i.e, the peripheral barrier region and tunneling barrier 3 are 6 nm and 3 nm as above, the total thickness of the barrier regions will be 24 nm and 33 nm, or more, for the cases using the least 2 or 3 active regions, respectively. The actual thickness of the barrier regions will be larger in fact with additional thickness of the low barrier regions in the active regions. In view of the fact that MIS type nonvolatile memories at present or in the near future require the gate insulator to be thinner to 10 nm for the purpose of realization of micronization and very large scale integration, the substantially thick insulator regions of the semiconductor device in the Japanese Publication are essentially not suitable for the devices of large scale integration.

SUMMARY OF THE INVENTION

An object of the present invention is to provide a semiconductor device which stores and processes data stably and at high speed with low power consumption, and a manufacturing method thereof, particularly, to provide a semiconductor memory device which satisfies at least the foregoing requirements (A) and (C) at a time, and preferably all the requirements (A) through (D) at a time in view of the above various problems, and a manufacturing method of the semiconductor memory device.

To achieve the objects, the semiconductor device according to the present invention has function allowing the conductive carriers to go in and out of the storage regions through barriers which have a multi-tunneling structure.

A first semiconductor device comprising a semiconductor substrate and at least one conductive carrier storage part for storing the conductive carriers, wherein the conductive carrier storage part includes at least two barrier regions having high energy level to give resistance against transfer of the conductive carriers and at least one storage region which is disposed between the barrier regions and has a low energy level to allow the conductive carriers to exist stably, and at least one of the barrier regions is adapted to have a multi-tunneling structure which comprises at least two tunneling barriers having an energy level to allow the conductive carriers to pass through the tunneling barriers by means of tunneling and at least two low barrier regions which is disposed between the tunneling barriers and having a lower energy level than the tunneling barriers.

The feature of the first semiconductor device provides that when the conductive carrier is held in the storage region in the conductive carrier storage part, reading information, i.e., existence/non-existence of the conductive carrier in the storage region can be performed by making use of polarization properties of insulation substance which forms the barrier region in the conductive carrier storage part. In addition, when the conductive carriers are transferred between the storage regions and the outside through the barrier regions having the multi-tunneling structure, it is enough to apply voltage lower than a voltage corresponding to an energy level of the concerned barrier region to control the conductive carriers. Hence, a lower voltage is sufficient for writing and erasing information, thereby achieving high reliability while enabling many times of re-writing information.

In case of reading information with the conduction carriers existing in the storage regions, when a low voltage is applied to the conductive carrier storage region, a part of the conductive carriers in the storage regions tend to transfer to the outside through the barrier regions having the multi-tunneling structure. There merely occurs quite a little transfer of conductive carriers since probability of carriers' passing through a plurality of tunneling barriers equals to multiplication of a probability of carriers' passing over a single tunneling barrier. In other words, non-destructive reading as well as data hold for a long time is feasible.

A second semiconductor device is based on the first semiconductor device wherein the storage region provided in the conductive carrier storage part is one and the barrier regions two, and one of the two barrier regions has the multi-tunneling structure, while the other not.

The feature allows the film thickness of the whole conductive carrier storage part to be extremely thin, thereby enabling to provide a semiconductor device microstructure and having larger scale integration.

A third semiconductor device is based on the first semiconductor device wherein the storage regions provided in the number of the conductive carrier storage part is two and the barrier regions three, and at least the barrier region between the storage regions has the multi-tunneling structure.

The feature provides that the barrier region having the multi-tunneling structure Is formed between the two storage regions provided in the conductive carrier storage part, so that the function of the first semiconductor device can be obtained by use of a change of polarization properties following conductive carriers' shift between the storage regions.

A fourth semiconductor device is based on the third semiconductor device wherein two barrier regions adjacent to surfaces of the storage regions opposed to their surfaces facing with each other do not have the multi-tunneling structure.

In this feature both ends of the conductive carrier storage part include the barrier regions having no multi-tunneling structure. Hence, conductive carriers once introduced into the storage regions do substantially not get over the barrier regions to flow outside and be lost, thereby enabling data hold for a quite long time.

A fifth semiconductor is based on the first to fourth semiconductor wherein a low barrier region in the barrier regions having the multi-tunneling structure is so adapted that an incident wave from one tunneling barrier and a reflected wave from the other tunneling barrier are identical in phase to each other. The low barrier region in the barrier regions having the multi-tunneling structure may be made of a thin film material having thickness equal to or lower than de Broglie wave of conductive carriers. Additionally, the low barrier region in the barrier regions having the multi-tunneling structure may be made of a thin film material having an energy level higher than that of the storage regions by a predetermined value.

The features provide that when the conductive carriers go through the barrier region having the multi-tunneling structure, the incident wave and reflected wave almost corresponds in phase to each other in the low barrier region, thereby causing the so-called resonance tunneling. Hence, even when a voltage applied to the conductive carrier storage part is a constant low value, probability that the conductive carriers go through the concerned barrier region is almost "1", thereby enabling a voltage for writing and erasing information to be set to a very low value, and improving the reliability of function of the device and enabling the number of writing to be increased.

In the first to fourth semiconductor device, a carrier supply may be provided in the conductive carrier storage part.

In the first to fourth semiconductor device, the conductive carrier storage part may be formed on the semiconductor substrate, on which provided are one source/drain region formed on the surface region of the substrate and at least partially adjoining to the conductive carrier storage part and an electrode formed on the conductive carrier storage part, so that the conductive carrier storage part functions as a memory part.

In the first to fourth semiconductor device, the conductive carrier storage part may be formed on the semiconductor substrate, there are provided two source/drain regions formed below near both ends of the conductive carrier storage part and a gate electrode formed on the conductive carrier storage part, so that the conductive carrier storage part functions as a memory part.

These features enables the semiconductor device to function as a flash EEPROM in which data can be written at high speed for a long time and which enables the large number of writing.

In the second semiconductor device, the conduction carrier storage part may be formed on the semiconductor substrate, on which provided are one source/drain region formed on the surface region of the substrate and at least partially adjoining to the conductive carrier storage part and an electrode formed on the conductive carrier storage part, so that storing and processing information is carried out corresponding to the amount of conductive carriers existing in the storage regions of the conductive carrier storage part.

In the third and fourth second device, the conductive carrier storage part may be formed on the semiconductor substrate, on which provided are one source/drain region formed on the surface region of the substrate and at least partially adjoining to the conductive carrier storage part and an electrode formed on the conductive carrier storage part, so that storing and processing information is carried out corresponding to the distribution ratio of conductive carriers into the two storage regions in the conductive carrier storage part.

In the second semiconductor device, the conduction carrier storage part may be formed on the semiconductor substrate, there are provided two source/drain regions formed below near both ends of the conductive carrier storage part and a gate electrode formed on the conductive carrier storage part, so that storing and processing information is performed corresponding to the amount of conductive carriers existing in the storage regions of the conductive carrier storage part.

In the third and fourth semiconductor device, the conductive carrier storage part may be formed on the semiconductor substrate, on which provided are two source/drain regions formed below near both ends of the conductive carrier storage part and a gate electrode formed on the conductive carrier storage part, so that storing and processing information is performed corresponding to the distribution ratio of conductive carriers into the two storage regions in the conductive carrier storage part.

These features enable various kinds of information to be stored, and enable analog information to be stored and read, thereby enabling the semiconductor device to have a larger applicable field.

At least one of the two source/drain regions may be spaced from the conductive carrier storage part to have a redetermined gap, and there may be provided at the side of the conductive carrier storage part spaced from the source/drain region having the predetermined gap therebetween an insulator side wall thinner than the size of the gap, a gate insulator formed on the semiconductor substrate from the dielectric side wall to the source/drain region, and a gate electrode on the gate dielectric, and the gate electrode may be made of a conductive material which is commonly used for the gate electrode on the conductive carrier storage part.

According to the feature, MISFET for memory having the conductive carrier storage part is provided at one side (or both sides) with another MISFET for optional use so that even when the semiconductor device is given larger scale integration, disturbing phenomena is prevented. A structure that the MISFET for memory and that for optional use may commonly use the gate electrode increase the device's integration to be suitable particularly for the case that the conductive carrier storage part including the barrier regions having the multi-tunneling structure is used as a memory cell.

In the first to fourth semiconductor device, the conductive carrier storage part may be interposed between a capacitance electrode and a plate electrode in the DRAM memory cell to function as a memory part.

In case that the tunneling barrier in the conduction carrier storage part is made of SiO2 thin film, the storage regions and low barrier region in the conductive carrier storage part may be made of Si thin film. In case that the tunneling barrier is Si3N4, the storage regions and low barrier region may be Si. In either case, the storage regions and low barrier region may be made of amorphous Si thin film.

In case that the tunneling barrier in the conduction carrier storage part is made of AlAs thin film, the storage regions and low barrier region in the conductive carrier storage part may be made of GaAs thin film. In case that the tunneling barrier is GaAlAs, the storage regions and low barrier region may be GaAs.

In case that the tunneling barrier in the conduction carrier storage part is made of SiO2 thin film, the storage regions and low barrier region in the conductive carrier storage part may be made of SiC thin film.

In case that the tunneling barrier in the conduction carrier storage part is made of GaAlN thin film, the storage regions and low barrier region in the conductive carrier storage part may be made of GaN thin film.

In case that the tunneling barrier in the conduction carrier storage part is made of Si thin film, the storage regions and low barrier region in the conductive carrier storage part may be made of SiGe thin film.

The tunneling barrier in the conduction carrier storage part may be made of a thin film of monocrystalline semiconductor, and the storage regions and low barrier region in the conductive carrier storage part may be made of a thin film of any materials which have the substantially same lattice constant as that on the surface of the monocrystalline semiconductor.

Furthermore, to achieve the foregoing objects, in the manufacturing method of semiconductor device according to the present invention, a semiconductor device has such function that conductive carriers are caused to go in and out of storage regions through barriers having a multi-tunneling structure.

A first method is a manufacturing method of a semiconductor device for forming a conductive carrier storage layer including composite layers between a first conductive member and a second conducive member, wherein a process for forming the conductive carrier storage layer is provided with a process for forming a first insulator layer having a high energy level to give resistance against transfer of the conductive carriers; a process for forming on the first insulator layer a first storage layer which has a low energy level to be capable of storing the conductive carriers; and a process for forming on the first storage layer a second insulator layer which has a high energy level to give resistance to transfer of the conductive carriers. And at least one of the processes for forming the dielectric layers is provided with a layer having a multi-tunneling structure which comprises alternately a tunneling insulator layer having an energy level higher than an energy level of the first conductive member and enabling the conductive carriers' passing-through with tunneling, and a low barrier layer having a low energy level lower than that of the tunneling insulator layer, and a lowermost part and a uppermost part of the multi-tunneling structure having tunneling dielectric layers.

A second manufacturing method is based on the first manufacturing method wherein formed in the process forming the first insulator layer is an insulator layer having the multi-tunneling structure and in that forming the second insulator layer an insulator layer having no multi-tunneling structure.

A third manufacturing method is based on the first manufacturing method wherein formed in the process forming the first insulator layer is an insulator layer having no multi-tunneling structure and in that forming the second insulator layer an insulator layer having the multi-tunneling structure. Additionally, the process forming the conductive carrier storage layer is provided further with a process forming on the second insulator layer a second storage layer having a low energy level to be capable of storing the conductive carriers, and a process forming on the second storage layer an insulator layer serving as a third insulator layer which has a high energy level to give resistance against transfer of the conductive carriers and has no multi-tunneling structure.

A fourth manufacturing method is based on the third manufacturing method wherein a process forming a supply of the conductive carriers is provided after the process forming the first insulator layer and before the process forming the second conductive member.

In those manufacturing methods, the processes may be carried out with particular features for manufacturing the semiconductor device having any of the features provided in the foregoing first to fourth semiconductor devices.

BRIEF DESCRIPTION OF THE DRAWINGS

FIG. 3 is an explanatory view showing a correlation between polarization and electric fields in the semiconductor device related to the first example.

FIG. 4 is explanatory views showing the result of simulation of a correlation between current Itunn and externally applied voltage Va following transfer of memory charges in various semiconductor devices, and an explanatory view showing modes of distribution of potential energy of electrons observed in the simulation.

FIGS. 7(a) to (e) are sectional views showing a changing structure of the semiconductor device in manufacture related to the second example.

FIG. 8 is a sectional view of a semiconductor device related to the third example.

DESCRIPTION OF PREFERRED EMBODIMENTS

Next, specific examples of the present invention will be detailed.

EXAMPLE 1

Figure 1A:
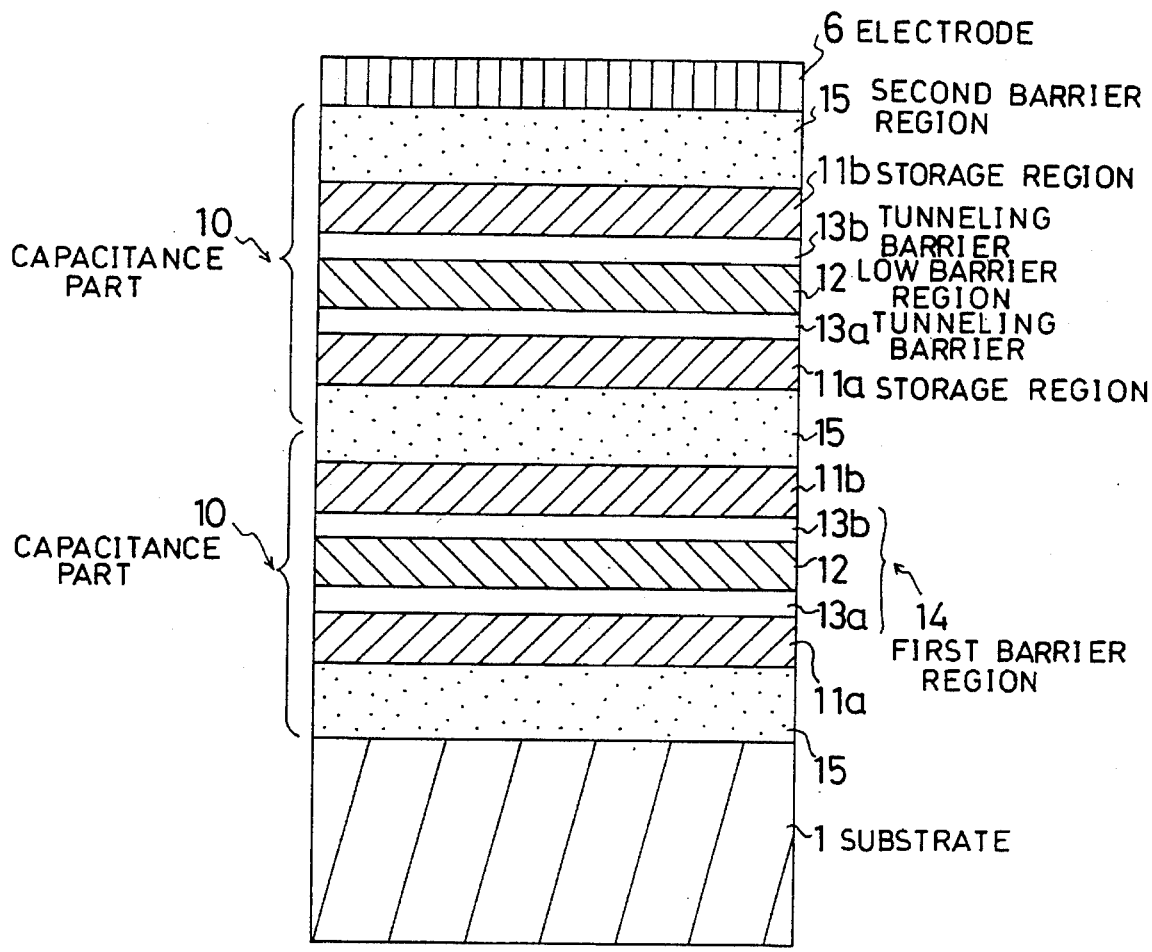
FIGS. 1(a) and (b) are a sectional view showing a semiconductor device related to the first example and an explanatory view showing distribution of potential energy of electrons.
Figure 2A:
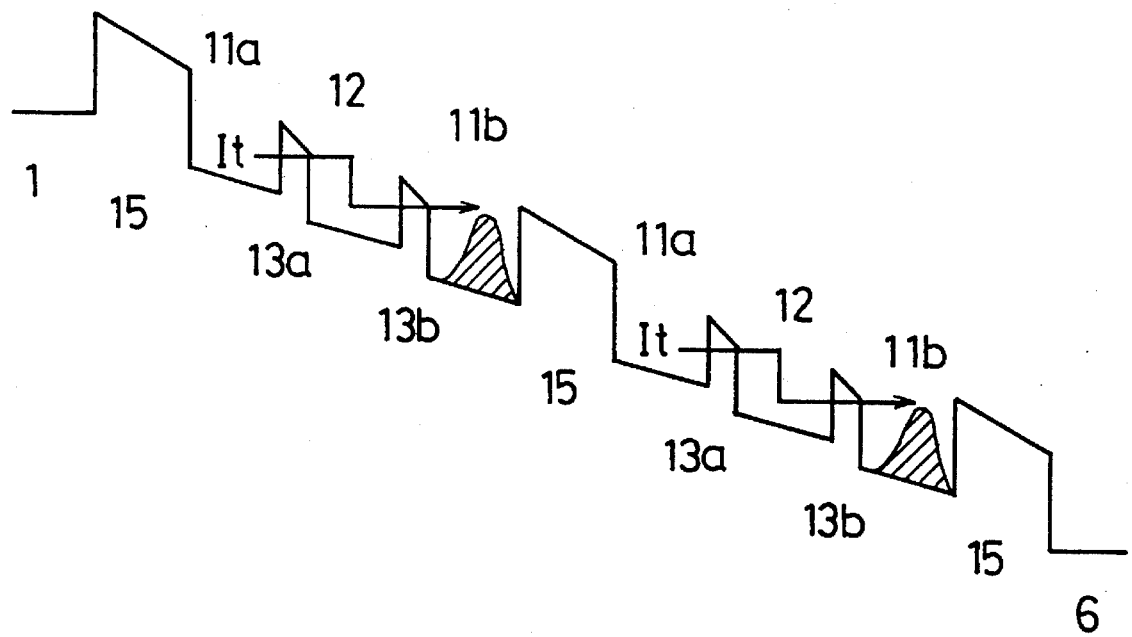
FIGS. 2(a) and (b) are explanatory views of distribution of potential energy of electrons when the electrode in the semiconductor device related to the first example is applied with a positive and negative voltage.
Figure 2B:
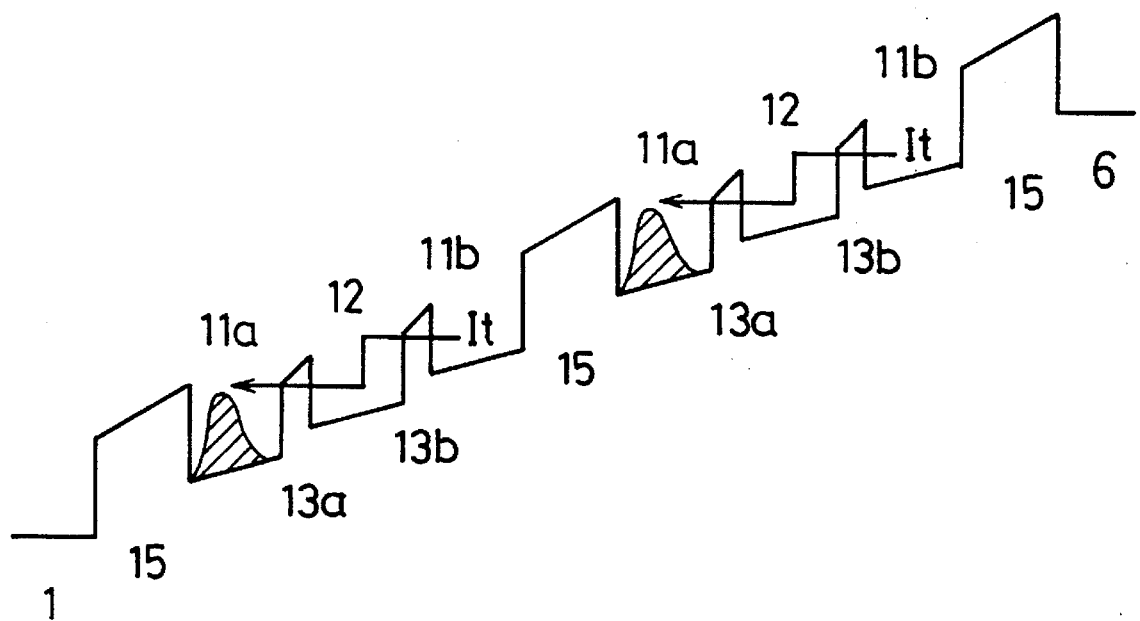

First, Example 1 will be detailed with referring to FIGS. 1(a) and (b), FIGS. 2(a) and (b), FIG. 3 and FIG. 4.

Figure 1B:
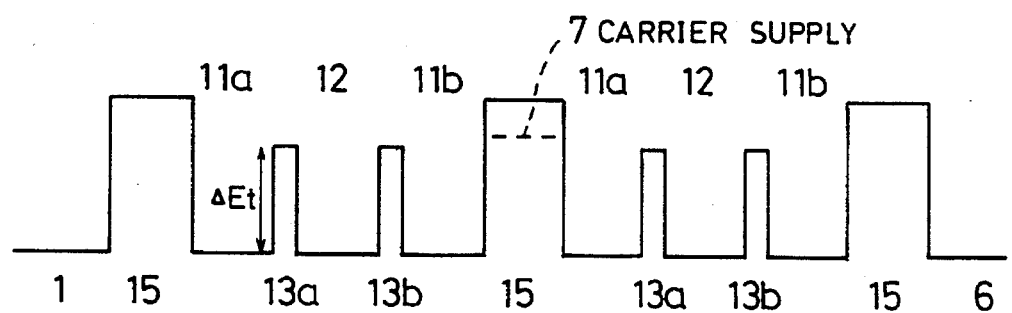

FIG. 1(a) is a sectional view showing a structure of a semiconductor device having a plurality of tunnelling barriers according to Example 1, and FIG. 1(b) is an explanatory view showing distribution of potential energy of electrons of the semiconductor. In the drawing, reference numeral i designates a substrate for the semiconductor made of Si mono crystal, 6 an electrode made of polycrystalline Si. Two capacitance parts 10 (conductive carrier storage part) are provided between the substrate 1 and the electrode 6. In the example, the substrate 1 is a source/drain region, but the electrode in place of the substrate may be so. Semiconductors made of Ge, GeAs or the like may be used for the substrate 1. The capacitance part 10 comprises two storage regions 11a, 11b in which conductive carriers are stored, a first barrier region 14 interposed between the storage regions 11a, 11b, and three second barrier regions 15 provided adjoining to surfaces of the storage regions 11a, 11b opposed to their surfaces adjacent to the first barrier region 14. In this example, the second barrier region 15 located centrally is commonly possessed by the capacitance parts 10. The first barrier region 14 includes two tunneling barriers 13a, 13b adjacent to the storage regions 11a, 11b, and a low barrier region 12 interposed between the tunneling barriers, and has a multi-tunneling structure. The second barrier region 15 located centrally is provided with a carrier supply 7.

As seen in FIG. 1(b), the storage regions 11a, 11b are made of a semiconductor, semi-insulator or metal having a smaller potential energy of electrons than the second barrier regions 15 and tunneling barriers 13a, 13b and is so constructed that conduction electrons are confined to the inside of the storage regions. The low barrier region 12 is made of semiconductor, semi-insulator or insulator having a smaller potential energy of electrons than the second barrier regions 15 and tunneling barriers 13a, 13b and being intrinsic or semi-intrinsic. The tunneling barriers 13a, 13b are made of a semiconductor having semi-insulator properties, semi-insulator or insulator having potential energy of electrons higher than the storage regions 11a, 11b by ΔEt. In this example, the second barrier regions 15 and the tunneling barriers 13a, 13b are formed with SiO2, and the storage regions 11a, 11b and the low barrier region 12 with amorphous Si. The carrier supply 7 (electrons in this example) is formed by introducing impurity atoms serving as donor into the SiO2 film forming the centrally located second barrier region 15. The carrier supply 7 when provided in the capacitance part 10 may be formed in any one, any combination or all of the second barrier region 15, tunneling barrier 13a, 13b, or storage region 11a, 11b. The carrier supply may be provided outside of the capacitance part 10, for example, an electric field is applied between the substrate 1 and the electrode 6 to initially flow F-N tunneling current therein and into the capacitance part, so that the conductive carriers are then confined in the capacitance part. In this case, either the substrate 1 (the source/drain) or the electrode 6 functions as the carrier supply.

In the example shown in FIG. 1(b), the carrier supply 7 is formed in the second barrier region is and conduction electrons are fed therefrom to the capacitance parts 10. In use of the semiconductor device, the conduction electrons exist mainly in one or both of the storage regions 11a and 11b. The tunneling barriers 13a, 13b are set to have a larger energy barrier ΔEt and be thin in film thickness sufficient for that electrons are moved between the low potential energy regions adjacent to the tunneling barriers not by thermal excitation but mainly with tunneling effect.

Concrete examples of combination of materials for the tunneling barriers 13a, 13b, low barrier region 12 and storage regions 11a, 11b include AlAs and GaAs, GaAlAs and GaAs, SiO2 and SiC, Si3N4 and Si, GaAlN and GaN, Si and SiGe, in addition to the foregoing combination SiO2 and Si in Example 1. Generally, the storage regions 11a and 11b often use the same material but may use different materials and be different in film thickness from each other. Also, the low barrier region 12 and the storage regions 11a, 11b may be different or equal in potential energy of electrons from or to each other and use the same materials. Furthermore, a plurality of tunneling barriers 13a, 13b may often use the same material and have the same film thickness or be different in materials and film thickness to one another. The tunneling barriers 13a, 13b and the second barrier regions 15 may be different from or equal to one another in potential energy of electrons, and may use the same material. Also, the second barrier regions 15 each may be different in film thickness. For example, the second barrier regions 15 are made of SiO2 of 5 to 30 nm in thickness, tunneling barriers 13a, 13b of SiO2 of 2–5 nm in thickness, and the low barrier region 12 and storage regions 11a, 11b of amorphous Si of 5 to 30 nm in thickness. The conductive carrier supply 7 is made of amorphous Si (forming the storage regions 11a, 11b) added with P atoms serving as donor impurity.

The conductive carriers in the above feature are electrons but may use positive holes. In this case, the carrier supply 7 is formed by introducing acceptor in stead of donor. For example, the second barrier regions 15 are made of AlAs of 5 to 30 nm in thickness, tunneling barriers 13a, 13b of AlAs of –5 nm in thickness, and the low barrier region 12 and storage regions 11a, 11b of GaAs of 5 to 30 nm in thickness. The conductive carrier supply 7 is made of AlAs (forming the second barrier regions 15) added with acceptor Mg atoms.

In FIGS. 1(a) and (b) the first barrier regions (having the multi-tunneling structure) 14 are each provided with two tunneling barriers 13a, 13b but may be provided with at least two or more, for example, three or more tunneling barriers with the low barrier region 12 increasing by one at a time whenever the tunneling barrier is increased by one at a time. Additionally, the number of the capacitance parts 10 is two in FIGS. 1(a) and (b) but may be at least one, for example, three or more. Using a single capacitance part 10 provides particular merits enabling a simplified device structure as favorably processed, as explained in the other Examples described later, and that an insulator layer or semi-insulator layer of MIS type semiconductor device replaced with the whole capacitance parts 10 can be made thin enough to be microstructure or have large scale integration. Additionally, a single or three or more storage regions other than two may be provided in the capacitance part 10 as the Examples described later.

Operation of the semiconductor device according to Example 1 will be detailed. In the capacitance parts 10 shown in FIGS. 1(a) and (b), conductive carriers (electrons in the case) generated by the carrier supply 7 exist in either or both of the storage regions 11a, 11b, so that information can be written and stored corresponding to the distribution ratio of electrons in the storage regions 11a, 11b. The conductive carriers are confined to the capacitances 10 and does not go over the second barrier region 15 to flow out to the outside and be lost through thermal excitation, thereby enabling information to be held and stored. For the purpose, the second barrier region 15 is set in energy barrier to be larger by 1 to 1.5 eV than the storage regions 11a, 11b and in film thickness to be thicker by 5–6 nm or more.

A predetermined voltage is applied between the semiconductor substrate 1 and the electrode 6 to change and control (re-write) the contents of information stored. It will be detailed with referring to FIGS. 2(a) and (b). FIG. 2(a) shows distribution of potential energy of electrons when the electrode is given a certain positive potential with respect to the substrate 1. Conductive carriers existing for example in the storage region 11a flow into the storage region 11b through the plurality of tunneling barriers 13a, 13b (assuming the current is Itunn in this case). Conductive carriers in the capacitance parts 10 are then distributed almost in the storage region 11b. When the electrode 6 has a negative potential with respect to the substrate 1, the electrons for example in the storage region 11b flow into the other storage region 11a through the tunneling barriers 13a, 13b. As described above, most of the conduction carries in the capacitance parts 10 exist locally in either storage region 11a or 11b, so that polarization occurs in the semiconductor device and can be inverted in orientation by an externally applied electric field. Orientation and extent of the polarization can be kept intact unless an electric field is applied externally. As a result, polarization in the semiconductor device and externally applied electric field have the hysteresis correlation as shown in FIG. 3, and storing information is performed by use of the hysteresis.

The semiconductor device according to Example 1 is characterized in that the conductive carriers are caused to pass through the plural (two or more) tunneling barriers when the content of information is to be changed or re-written. Function and effects of the feature will be explained with FIG. 4. Assuming probability that conductive carriers pass through a single tunneling barrier is T, probability that the carriers pass through n tunneling barriers is expressed simply by $T^n$. In this case, the current Itunn flowing from one storage region (e.g., the region 11a) to the other (11b) is almost proportional to the probability and may be expressed as Itunn=$kT^n$ (wherein n is integer and k is constant). Current Itunn in Example 1 using $n \geq 2$ when compared with the conventional art using n=1 is $T^{n-1}$ times. In detail, when high electric field is applied to provide high tunneling probability, Example 1 and the conventional art do have substantially no difference in current Itunn. In case using low electric field making low tunneling probability, current Itunn in Example 1 can be made notably lower than the conventional art.

E2 in FIG. 4 shows distribution of potential energy of electrons with the most simple feature having one capacitance part 10 and only two tunneling barriers 13a, 13b according to Example 1, E2 showing a characteristic curve obtained from calculation of correlation between current Itunn and externally applied voltage Va corresponding to the above feature. The second barrier region 15 of about 6 nm thickness, storage regions 11a, 11b and low barrier region 12 each of about 10 nm thickness are made of the same material, and tunneling barriers 13a, 13b of about 3 nm thickness has energy gap ΔEt of 1.4 eV (shown by broken lines) and 3.2 eV (solid line) (under a condition enabling occurrence of the direct tunneling). The energy gap ΔEt is 1.4 eV when the tunneling barriers 13a, 13b are made of AlAs and the storage regions 11a, 11b of GaAs. And energy gap ΔEt is 3.2 eV when the tunneling barriers made of SiO2 and the storage regions of Si. A semiconductor device of the foregoing Japanese publication has the distribution of potential energy of electrons shown by E1 in FIG. 4 and has no low barrier region 12 but having only one tunneling barrier with respect to the structure of capacitance part 10 in Example 1 (E2 in FIG. 4). Difference in structure of the semiconductor device leads to large difference in Itunn-Va characteristic between them. In detail, it is appreciated that re-writing in Example 1 (E2 curve) requires slightly higher voltage Va than the conventional art but obtains higher current Itunn as high as the conventional art (E1 curve), and current Itunn in the low voltage range corresponding to data hold and reading is remarkably lowered than the conventional art. As seen, Example 1 which provides at the capacitance parts 10 with the first barrier region 14 having the multi-tunneling structure including the plural (two or more) tunneling barriers 13a, 13b and low barrier region 12 satisfies at a time both the requirements (A) and (C) required for the ideal semiconductor memory as referred to at the "tasks the invention solves", obtaining a particular effect as having a practically sufficiently applicable data hold characteristic not found in the conventional art.

The above example has been explained with the case using two tunneling barriers 3. Using three or more tunneling berries obtains the same result as the case using two tunneling barriers except that the degree of effects should be more notable.

The essentially same conclusion will be obtained even when using other values than those in Example 1 for thickness of tunneling barriers 13a, 13b, energy gap ΔEt, thickness of second barrier regions 15 and low barrier region. A semiconductor when used for the low barrier region 12 may be intrinsic, semi-insulation or high resistant for the purpose of minimizing dispersion in the tunneling process. The low barrier region 12 may be made of a low-resistant semiconductor. The explanation has been made based on the result of simulation of the case using only one capacitance part. The same conclusion will be given with using a plurality of capacitance parts 10. Furthermore, the same function and effects as above will be provided using positive holes in place of electrons for the conductive carriers.

The capacitance parts 10 in Example 1 when used for a storage capacitance to form, for example, DRAM memory cells may constitute nonvolatile RAMs, wherein the capacitance parts are interposed, for example, between a capacitance electrode and a plate electrode, i.e., are substituted for the capacitance insulator in the conventional DRAM memory cells. In this case, since the semiconductor device in Example 1 has self-polarization effect, extent (or orientation) of current flowing the switching MOSFET (another component for DRAM memory cells) varies corresponding to orientation and extent of that polarization, which is made use of for reading data stored. That is, nonvolatile RAMs according to Example 1 has function of self-amplification of data signals as not the conventional DRAMs., enabling higher speed reading.

Orientation and extent of polarization in the non-volatile RAMs using the above capacitance parts 10 are kept intact with an electric field being low or less corresponding to reading, thereby providing merits as not necessitating refreshing data as in the conventional DRAMs but achieving low power consumption. As seen, using the semiconductor device according to Example 1 realizes nonvolatile RAMs operable at high speed with low power consumption.

EXAMPLE 2

Figure 5A:
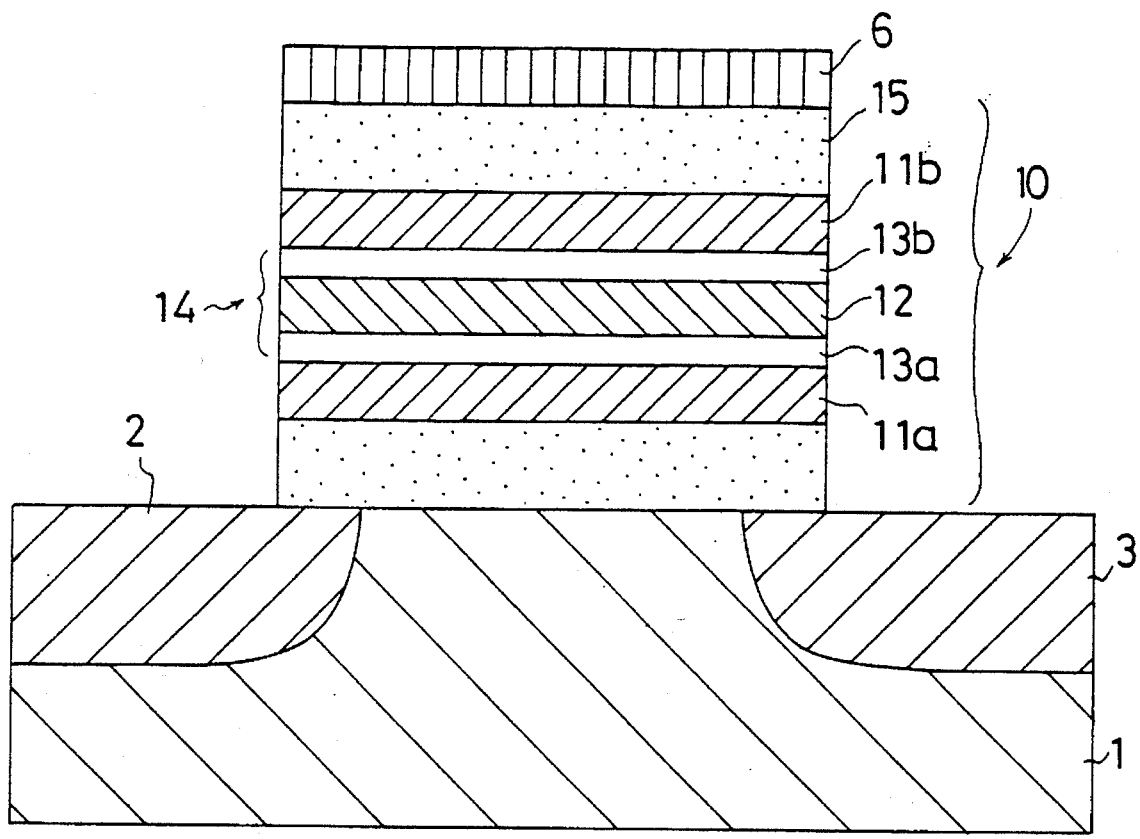
FIGS. 5(a) and (b) are a sectional view of MISFET semiconductor device related to the first example and an explanatory view showing distribution of potential energy of electrons.
Figure 6:
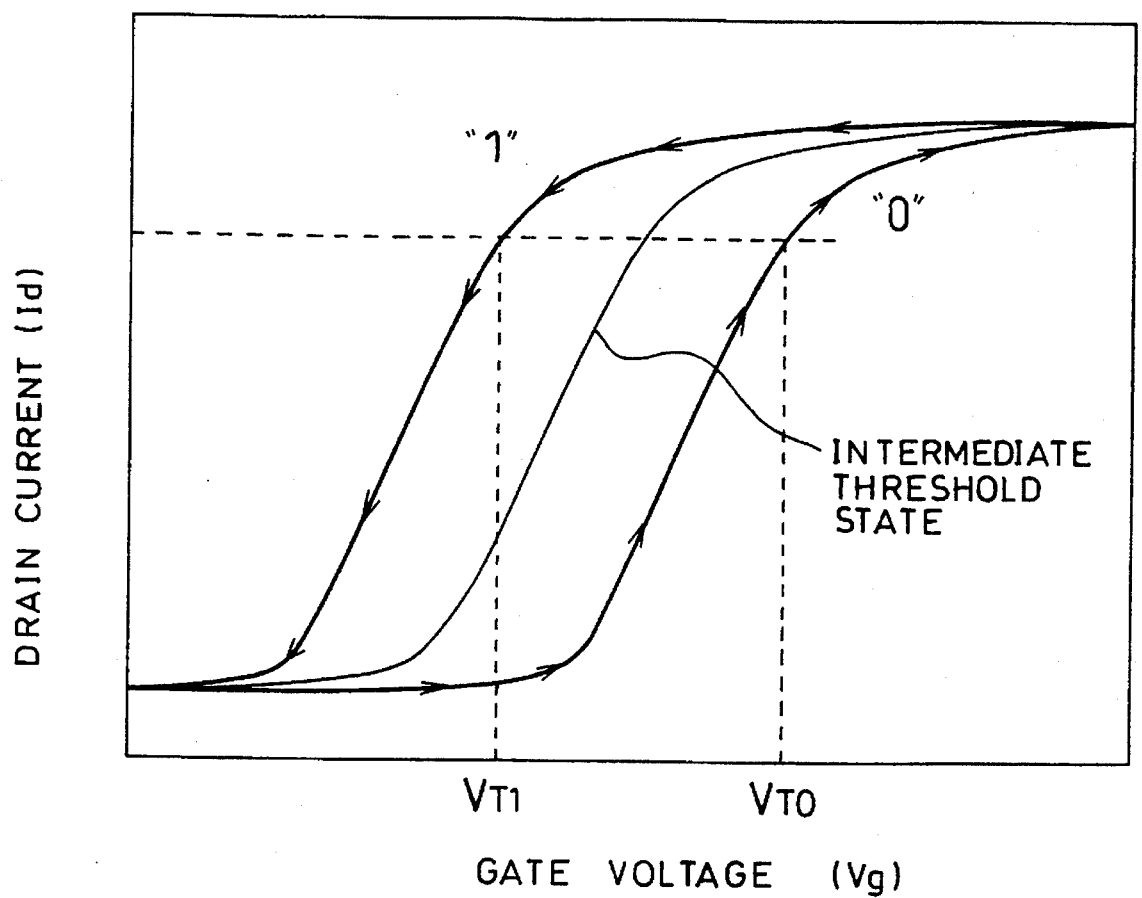
FIG. 6 is a characteristic chart showing correlation between drain current Id and gate voltage Vg in MISFET semiconductor device related to the second example.

Next, Example 2 will be detailed with referring to FIGS. 5(a),(b) and FIG. 6 and FIGS. 7(a) and (b).

FIGS. 5(a) and (b) show a sectional view of MISFET including a single capacitance part 10 which has the same lo structure as that referred to in Example 1, and distribution of potential energy of electrons. As seen in FIG. 5(a), the semiconductor substrate 1 is provided thereon with a capacitance part 10 on which a gate electrode 6 is deposited. The substrate 1 has on the surface region below both ends of the capacitance part 10 a source region 2 and a drain region 3 each provided by introducing impurities into the substrate 1. The capacitance part 10 has the basically same structure as of that shown in FIG. 1(a) while the carrier supply 7 is not formed in the tunneling barriers 13a, 13b.

For the source region 2 and drain region 3 distribution of the impurity atoms is generally identical but may be different. FIGS. 5(a), (b) exemplifies the case using the carrier supply 7 in the tunneling barriers 13a, 13b. The carrier supply 7 may be formed in a second barrier region 15 or storage region 11a, 11b. In case that the carrier supply 7 is formed outside the capacitance part 10, hot carrier may be generated between the source region 2 and the drain region 3 to be fed into the capacitance part 10, or an electric field may be applied between the source 2 or drain 3 and the gate electrode 6 to generate F-N tunneling current, so that conductive carriers are fed into the capacitance 10.

FIGS. 5(a) and (b) show the capacitance parts 10 each having two tunneling barriers 13a, 13b. Each capacitance part may be provided with at least two or more, for example, three or more tunneling barriers as the low barrier region is increased one at a time whenever the tunneling barrier increases one at a time. The capacitance parts 10, two used in FIG. 1(a), (b), may be at least one, or three or more.

Using a single capacitance part 10 enables its structure to be simple and favorable in processing, and further enabling the whole capacitance part 10 to be thin in thickness. When forming the second barrier regions 15 and tunneling barriers 13a, 13b with SiO2 with thickness of 6 nm and 3 nm, respectively, and the storage regions 11a, 11b and low barrier region 12 as a whole with Si of 10 nm in thickness, the whole capacitance part 10 is restricted in thickness of SiO2 to about 28 nm. That is, using a single capacitance part 10 has the merit enabling the semiconductor device to be microstructure and have large scale integration. The storage regions, two 11a, 11b provided in the capacitance part in this Example, may be single or three or more as in the Examples described later.

Next, operation of MISFET in this Example will be explained with referring to FIG. 6. Depending on that the conductive carriers exist mainly in the storage region 11a or 11b, MISFET will be in the states showing high threshold value VT0 or low threshold value VT1 (the threshold values VT0 and VT1 will be hereunder assumed as voltages corresponding to a predetermined current Ids). Hence, corresponding to the hysteresis of polarization-electric field curve shown in FIG.3, the correlation between drain current ID and gate voltage VG in the MISFET also have the hysteresis as shown in FIG. 6, so that information is stored by use of the hysteresis characteristic. The states that the threshold VT is high at VT0 and low at VT1 are adapted to correspond to digital signals "0" and "1" to enable the MISFET according to this Example to be substituted for flash EEPROM memory cells.

Va-Itunn characteristic in this case apparently shows the characteristic curve E2 in FIG. 4. Hence, the conductive carriers in this Example moves only inside the capacitance part 10 but does not flow to the outside to be lost, only requiring very low power consumption while enabling stably holding data for a long term in comparison with the conventional flash EEPROMs. Furthermore, when the conduction electrons in the capacitance part exist in both of two storage regions 11a, 11b in a certain ratio, MISFET has intermediate threshold VTm between VT0 and VT1 as shown in FIG. 6 by thin solid line, which feature may be made use of for storing analog signals or multivalued logic signals. The state having the intermediate threshold can be realized by fully shortening pulse width in writing or erasing data with respect to time required for the shift of the whole number of conductive carriers in the capacitance part 10 from one storage region 11a (or 11b) to the other 11b (or 11a), or by changing voltages for writing or erasing. In addition, MISFET according to this Example may be utilized for processing information by use of the above characteristic. Writing pulse width may be set to allow threshold VT to gradually change corresponding to the number of pulse signals for writing, which feature is used for integrating. FIG. 6 shows an example of n-channel MISFET formed on p-semiconductor substrate 1. The Example is applicable also top-channel MISFET on n-semiconductor substrate, having the same function and effects as of the case using n-channel MISFET.

Next, a manufacturing process of MISFET having the above construction will be detailed with referring to FIGS. 7(a) and (b).

First formed by thermal oxidation on the semiconductor substrate 1 is a first insulator 22 of SiO2 of about 6 nm in thickness (See FIG. 7(a)). A first semiconductor film 23 of amorphous Si of about 10 nm in thickness is deposited on the first insulator 22 by CVD (FIG. 7(b)).

Next, the first semiconductor film 23 is oxidized at a layer near the surface at low temperature to form a first tunneling insulator 24 of SiO2 of about 3 nm in thickness, followed by depositing thereon a semi-insulation semiconductor film 25 of amorphous Si of about 6 nm in thickness and oxidizing the layer near the surface to form a second tunneling insulator 26 of SiO2 of about 3 nm in thickness (FIG. 7(c)). When using three or more tunneling barriers, deposition of amorphous Si and oxidizing the surface may be repeated corresponding to the specific number of tunneling barriers and low barrier regions.

Next, a second semiconductor film 27 of amorphous Si of about 10 nm in thickness is deposited on the second tunneling insulator 26 by CVD, followed by forming a second insulator 28 of SiO2 of about 6 nm in thickness by CVD, on which deposited is polycrystalline Si film 29 of 300 nm in thickness applied with phosphorus (P) (FIG. 7(d)).

In case of providing the carrier supply 7 inside the capacitance part 10, the carrier supply 7 may be formed by ion-implantation of phosphorus into any one, two, three, four, five or all of the first insulator 22, first semiconductor film 23, first tunneling insulator 24, second tunneling insulator 26, second semiconductor film 27 and second insulator 28 after the process forming the first insulator 22 and before the process forming the polycrystalline film 29. This process is for the case applying a donor for the conductive carrier supply. Alternatively, acceptor may be applied, for example, by ion-implantation of boron (B).

After forming the composite film on the semiconductor substrate 1, a part of any regions of the composite film is removed, for example, by exposure to light or etching to pattern the gate electrode 6 and capacitance part 10, followed by ion-implantation of arsenic (As) using the patterned composite film as a mask to form the source 2 and drain 3 in a self-matching manner, and finally selectively forming a source electrode 4 and a drain electrode 5 of Al of about 800 nm in thickness by vapor deposition (FIG. 7(e)).

As seen from FIGS. 7(d) and (e), patterning the composite film as above makes the first insulator 22 and second insulator 28 into the second barrier regions 15, the first and second semiconductor films 23 and 27 into the storage regions 11a, 11b, the first and second tunneling insulators 24, 26 into the tunneling barriers 13a, 13b, the semi-insulation semiconductor 25 into the low barrier region 12, and the polycrystalline Si film 29 into the gate electrode 6.

The above processes fabricate MISFET including the capacitance part 10 as shown in FIG. 5(a). Explanation of Example 1 omits reference to manufacturing processes of the semiconductor device. Essential structure thereof is the same as of MISFET according to this Example and may be formed by the same processes as those shown in FIGS. 7(a) to (e).

The first insulator 22, second insulator 27, first tunneling insulator 24 and second tunneling insulator 26 may be made of silicon nitride oxide, silicon nitride or a composite thereof other than silicon oxide (SiO2). In the process forming the carrier supply 7 in a film, the carrier supply 7 may be formed simultaneously with formation of that film. For example, one or both of the first semiconductor film 23 and second semiconductor film 27 may be formed by CVD doping phosphorus (P) simultaneously with formation of Si film. The amount of doping of phosphorus into the Si film may be in the range of 1017 to 1020 (atoms/cm−3). As or when required, the semi-insulation semiconductor film 25 may be made thicker, for example, to 10 to 30 nm or employ a semiconductor film of amorphous SiC having higher potential energy of electrons than the first and second semiconductor film 23, 27. Also, the whole processes above may be carried out in reverse order.

17

EXAMPLE 3

Figure 9A:
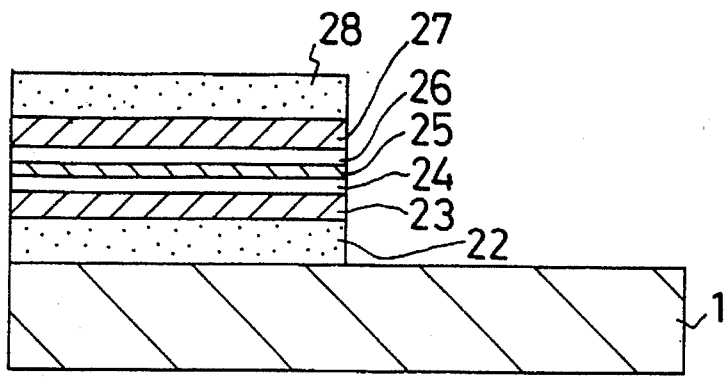
FIGS. 9(a) to (d) are sectional views showing a changing structure of a semiconductor device in manufacture related to the fourth example.

Next, Example 3 will be detailed with referring to FIGS. 8 and 9(a) and (b).

Figure 5B:
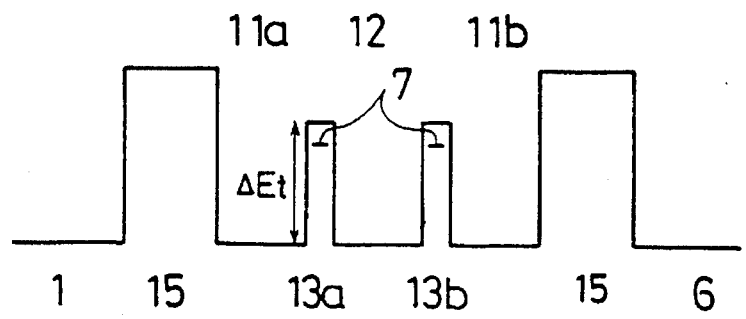
Figure 22:
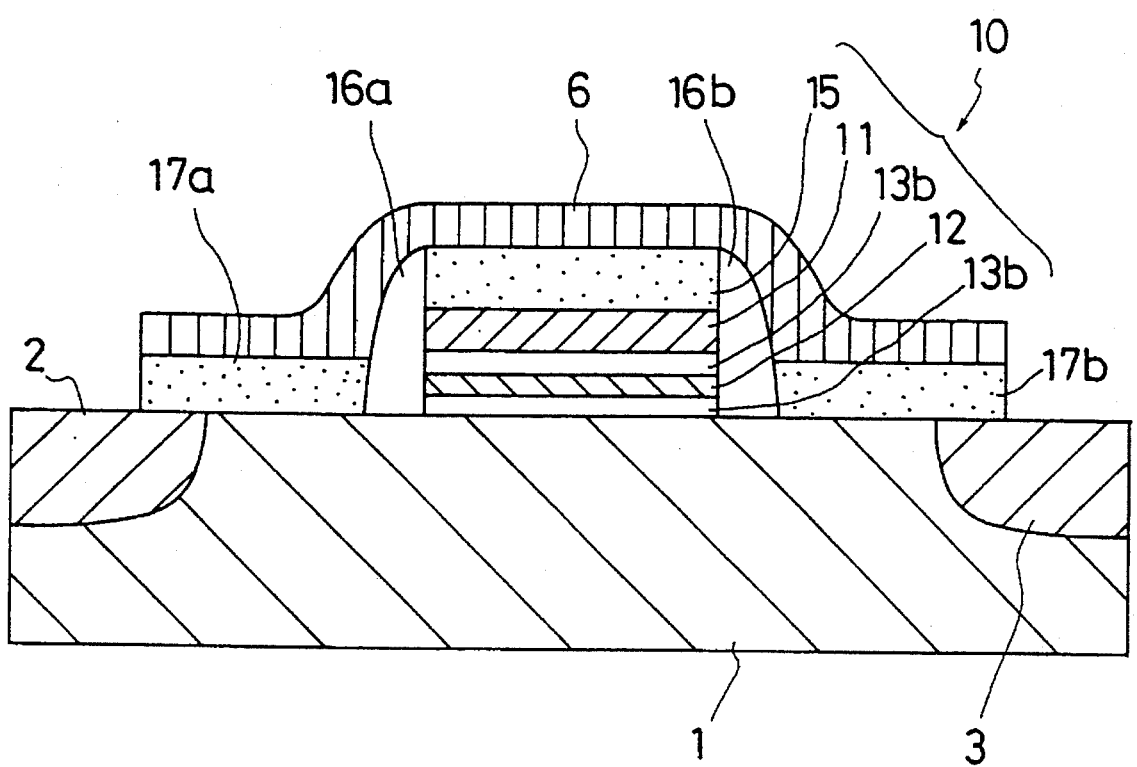
FIG. 22 is a sectional view of a semiconductor device related to the ninth example.

FIG. 8 is a sectional view showing a part of the semiconductor device according to Example 3. The semiconductor device includes MISFET having the construction of Example 2 and a general MISFET extending in series to and along a direction of the channel of that MISFET. As seen, the portion near the source region 2 (left half of the drawing) is the MISFET having the construction shown in FIG. 5, and the remaining portion near the drain region 3 (right half of the drawing) the general MISFET having the general gate insulator 17. The MISFETs are separated by a side wall 16 made of an insulator or a semi-insulation semiconductor and commonly have the gate electrode 6. When using Si for the semiconductor substrate 1, the gate insulator 17 may be made of SiO2 of about 5 to 30 nm in thickness, and the side wall 16 of SiO2, Si3N4 or composite thereof of about 50 to 300 nm in thickness in section. The general MISFET for selective or optional use is often used for effectively preventing the so-called disturbing phenomenon that writing in a memory cell in semiconductor memory integrated circuits happen to have interference with an adjoining memory cell to change the storage state therein. The construction shown in FIG. 8 enables both of the MOSFET for memory according to Example 2 and the optional MOSFET to be placed in a quite small area, thereby providing large scale integration and effective prevention of the disturbing phenomenon. The optional MISFET may be disposed at the side of the source region with respect to the memory MISFET as described later in other Example shown in FIG. 14, or at the side of drain region 3 and the side of source region with respect to the memory MISFET as shown in FIG. 22 Example.

FIGS. 9(a) and (b) shows a manufacturing method of the semiconductor device according to Example 3, wherein processes common to those of Example 2 are not shown. After completion of the process forming the second insulator 28 shown in FIG. 7(d), the composite film (that forms the capacitance part) including specific films from the first insulator 22 to second insulator 28 is partially removed by use, for example, of exposure to light and etching to then be subjected to the patterning process (FIG. 9(a)).

Figure 9B:
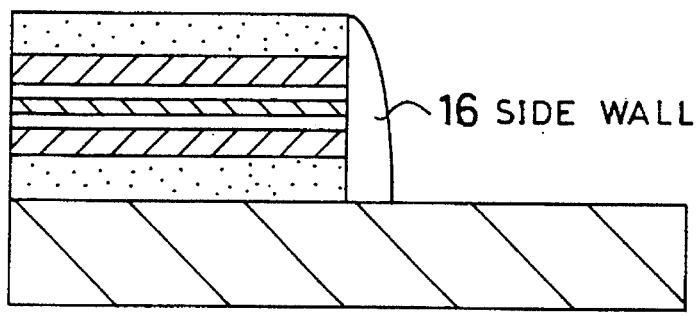

Next, an insulator film of SiO2 of about 10 nm in thickness is deposited on the whole surface of the patterned composite by CVD, followed by performing nonisotropic etching to provide a side wall 16 only at one side of the patterned composite film (FIG. 9(b)).

Figure 9C:
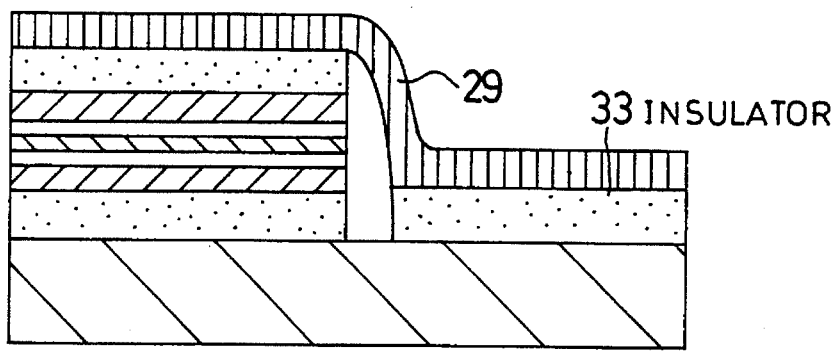

An insulator film 33 of SiO2 of about 10 nm in thickness is formed by thermal oxidation on the part of substrate 1 exposed and not covered by the patterned composite film and the side wall 16, followed by CVD doping phosphorus (P) to form polycrystalline Si film 29 of 300 nm in thickness on the whole surface (FIG. 9(c)).

Figure 9D:
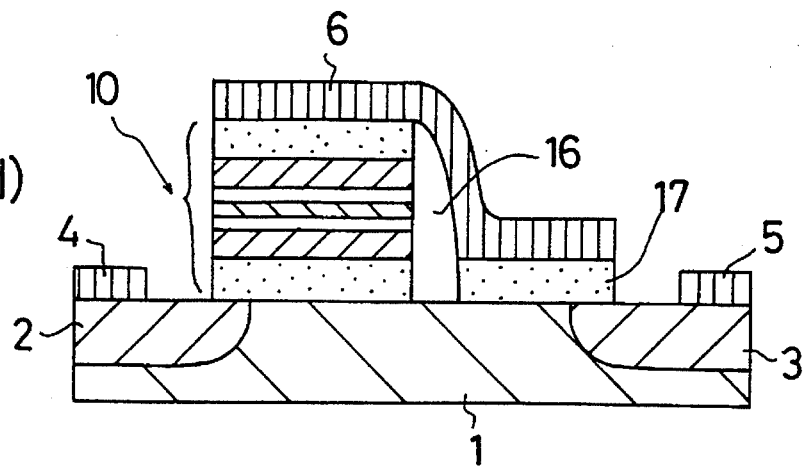

Next, as seen in FIG. 9(d), the composite film including the insulator 33, side wall 16, polycrystalline Si film 29, etc. formed on the substrate 1 is partially removed by use, for example, of exposure to light and etching to then be subjected to patterning for a capacitance part 10, followed by ion-implantation of arsenic (As) using the composite film including the patterned capacitance part 10, etc., as a mask to form a source region 2 and drain region 3 in a self-matching manner. Additionally, a source electrode 4 and a drain electrode 5 are selectively formed using a Al film of 800 nm in thickness, for example, by vapor deposition.

In the process shown in FIG. 9(d), the composite film is partially removed by etching, so that the substrate 1 is exposed at this portion. The etching process may be carried out with a part or all of the first insulator 22 being kept intact on the substrate.

EXAMPLE 4

Figure 10A:
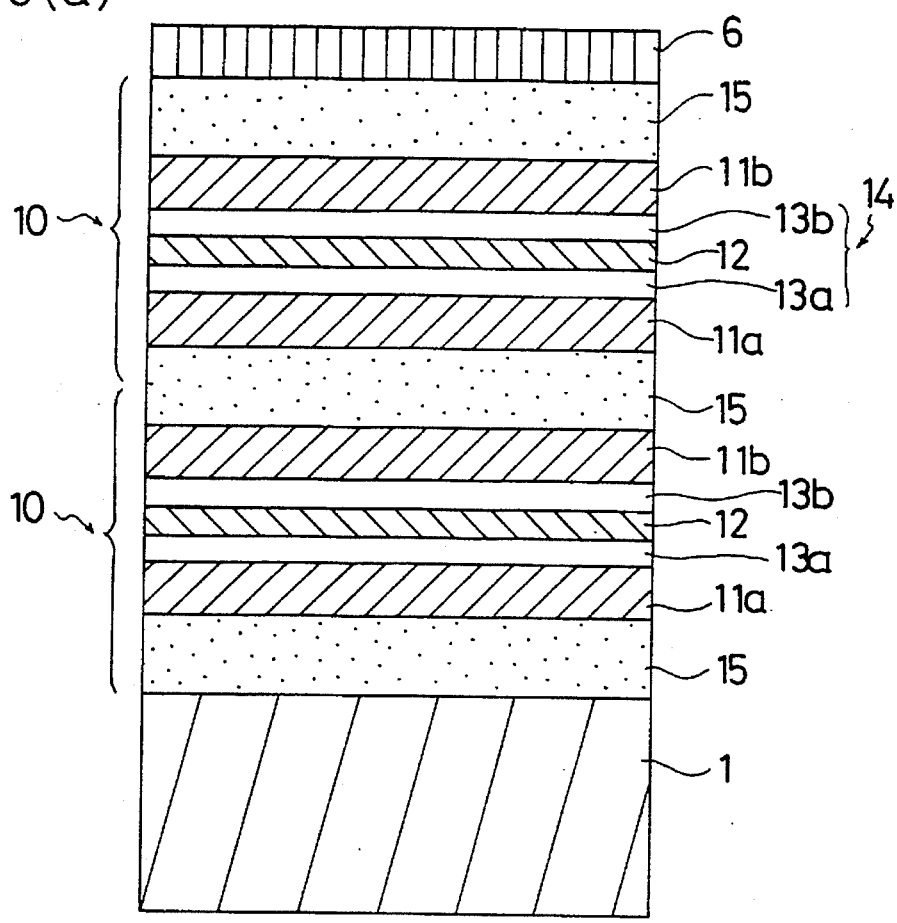
FIGS. 10(a) to (c) are a sectional view showing a essential structure of the semiconductor device related to the fourth example, and explanatory views showing distribution of potential energy of electrons with the low barrier regions having the first or second structure.

Next, a semiconductor device according to Example 4 of the present invention will be detailed with referring to FIGS. 10(a), (b) and (c), 11(a) and (b) and 12(a) and (b).

Figure 10B:
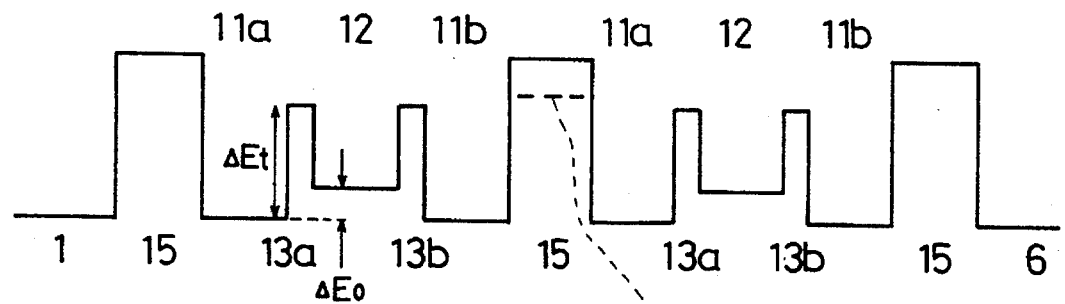
Figure 10C:
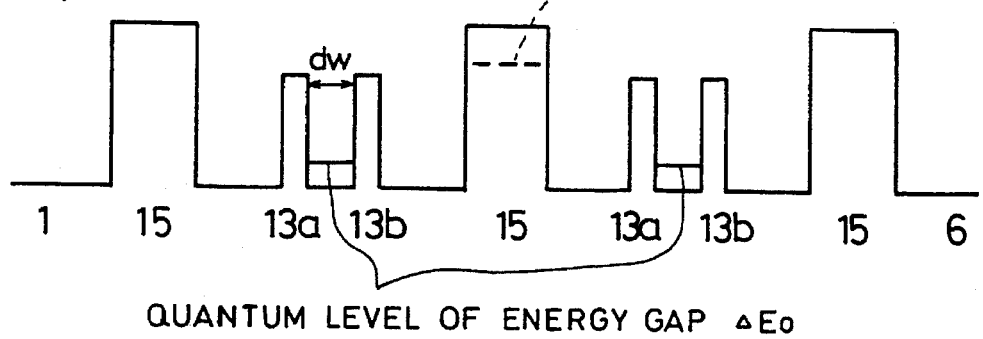

FIG. 10(a) shows a sectional view showing a structure of a semiconductor device related to Example 2. Geometrical sectional shape of the device is the same as of that shown in FIG. 1(a) related to Example 1 and explanation thereon is omitted here. In this Example, the low barrier region 12 and two tunneling barriers 13a, 13b in each capacitance part 10 form a multi-tunneling barrier which generates resonance tunneling. FIGS. 10(b) and (c) show distribution of potential energy of electrons of the semiconductor device, FIG. 10(b) relating to the case that the low barrier region 12 has higher potential energy of electrons than the storage regions 11a, 11b (this is the "second case"), and FIG. 10(c) to the case that the low barrier region 12 is equal or less in thickness to or than de Broglie wave (this is the "first case"). The storage regions 11a, 11b are made of a semiconductor, semi-insulator, or metal having lower potential energy of electrons than the second barrier region 15 and tunneling barriers 13a, 13b and can confine conduction electrons to the inside of the storage regions. Tunneling barriers 13a, 13b are made of a semi-insulation semiconductor, semi-insulator or insulator having higher potential energy of electrons than storage regions 11a, 11b by $\Delta Et$ and are set in the energy gap $\Delta Et$ and thickness to be high and thinner enough to allow electrons to move, mainly by tunneling effect not by thermal excitation, between the low potential energy of electrons regions adjoining to the tunneling regions. The lower barrier region 12 is made of an intrinsic or semi-intrinsic semiconductor, semi-insulator or insulator and has lower potential energy of electrons, and provided with any of the following features. In the "first case", the low barrier region 12 has thickness dw equal to or lower than de Broglie wave of conductive carriers (about 10 nm for electrons), and in the "second case" the lower barrier region 15 has potential energy of electrons higher by $\Delta EO$ than the storage regions 11a, 11b. In case that thickness of the region sandwiched by energy barriers is equal to or lower than the de Broglie wave of conductive carriers as in the "first case", incident wave and reflected wave between the tunneling barriers 13a and 13b are substantially equal in phase to each other, and the low barrier region 12 forms the so-called quantum well having standing wave and achieves therein a quantum level of energy gap $\Delta EO$. The low barrier region 12 may simultaneously satisfy the requirements cited in both the "first and second cases".

In this Example, the carrier supply 7 may be made of impurity atoms serving as donor and may be provided in any location inside the capacitance part 10 or outside thereof. Concrete examples of combination of materials for the tunneling barriers 13a, 13b, and storage regions 11a, 11b include AlAs and GaAs, SiO2 and Si, GaAlAs and GaAs, SiO2 and SiC, Si3N4 and Si, GaAlN and GaN, and Si and SiGe. Generally, the storage regions 11a and 11b often use the same material but may use different materials and be different in film thickness from each other. Furthermore, a plurality of tunneling barriers 13a, 13b may often use the same material and have the same film thickness or be different in materials and film thickness to one another.

The tunneling barriers 13a, 13b and the second barrier regions 15 may be different from or equal to one another in potential energy of electrons, and may use the same material. Also, the second barrier regions 15 each may have different film thickness.

Also, in the "first case", the low barrier region 12 and the storage regions 11a, 11b may be different or equal in potential energy of electrons from or to each other and use the same materials. Concrete examples in this case are that: the second barrier regions 15 are made of SiO2 of 5 to 30 nm in thickness, tunneling barriers 13a, 13b of SiO2 of 2–5 nm in thickness, and the low barrier region 12 and storage regions 11a, 11b each of Si of 2 to 10 nm in thickness. The carrier supply 7 is made of Si (forming the storage regions 11a, 11b) added with phosphorus (P) serving as donor impurity. Also, in the "second case", concrete examples of combination of materials for the tunneling barriers 13a, 13b (forming the multi-tunneling barrier) and low barrier region 12 may include AlAs and AlGaAs, SiO2 and Si, AlAs and GaAs, SiO2 and SiC, SiO2 and Si3N4, Si3N4 and Si. AlN and GaAlN, or Si and SiGe. Concrete examples in this case are that: the second barrier regions 15 are made of SiO2 of 5 to 30 nm in thickness, tunneling barriers 13a, 13b of SiO2 of 2–5 nm in thickness, and the low barrier region 12 and storage regions 11a, 11b each of SiC and Si of 5 to 30 nm in thickness. The carrier supply 7 is made of Si (forming the storage regions 11a, 11b) added with As (donor impurity atom).

The conductive carriers in the above feature are electrons but may use positive holes. In this case, the carrier supply 7 is formed by introducing acceptor in stead of donor. In the "second case", for example, the second barrier regions 15 are made of AlAs of 5 to 30 nm in thickness, tunneling barriers 13a, 13b of AlAs of 2–5 nm in thickness, and the low barrier region 12 and storage regions 11a, 11b of AlGaAs and GaAs of 5 to 30 nm in thickness. The carrier supply 7 is made of AlAs (forming the second barrier regions 15) added with acceptor Mg atoms.

In FIGS. 10(a), (b) and (c) the case using two tunneling barriers 13a, 13b are exemplified. The tunneling barriers in the capacitance parts 10 may be at least two or more, for example, three, four or more, e.g., ten. In this case, tunneling barriers and the low barrier region each increases one at a time whenever the tunneling barrier is increased one at a time. Additionally, the capacitance parts 10 are two in FIGS. 10(a), (b) and (c) but may be at least one, for example, three, four or more, e.g., ten. Using a single capacitance part 10 provides particular merits enabling a simplified device structure as favorably processed, and that the capacitance parts 10 when provided in MIS type semiconductor can be made thin enough to allow the whole semiconductor device to be microstructure or have large scale integration. (The case using a single capacitance part will be explained with referring to a concrete example providing MISFET shown in FIG. 13.)

Operation of the semiconductor device according to Example 4 will be detailed. In the capacitance parts 10 shown in FIGS. 10(a), conductive carriers (electrons in the case) generated by the carrier supply 7 exist in either or both of the storage regions 11a, 11b, so that information can be written and stored corresponding to the distribution ratio of electrons in the storage regions 11a, 11b. The conductive carriers are confined to the capacitances 10 and does not go over the second barrier region 15 to flow out to the outside and be lost through thermal excitation, thereby enabling information to be held and stored. For the purpose, the second barrier region 15 is set in energy barrier to be larger as 1 to 1.5 eV than the storage regions 11a, 11b and in film thickness to be thicker by 5–6 nm or more. Additionally, a predetermined voltage is applied between the semiconductor substrate 1 (or electrode) and the electrode 6 to change and control (re-write) the contents of information stored. It will be detailed with referring to FIGS. 11(a) and (b) and FIGS. 12(a) and (b) with respect to the "first and second cases".

Figure 11A:
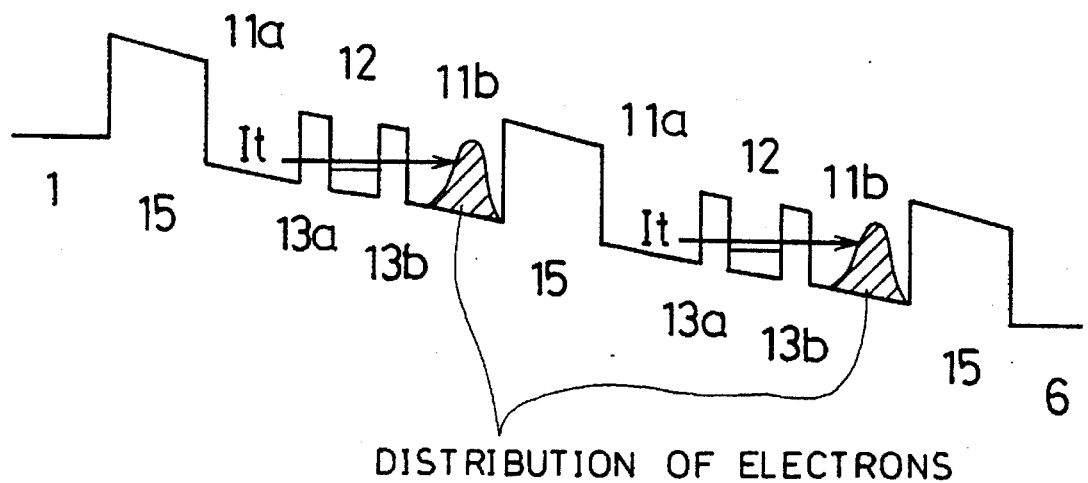
FIGS. 11(a) and (b) are explanatory views of distribution of potential energy of electrons when the electrode is applied with a positive and negative voltage in case that the low barrier regions related to the fourth example have the first structure.
Figure 11B:
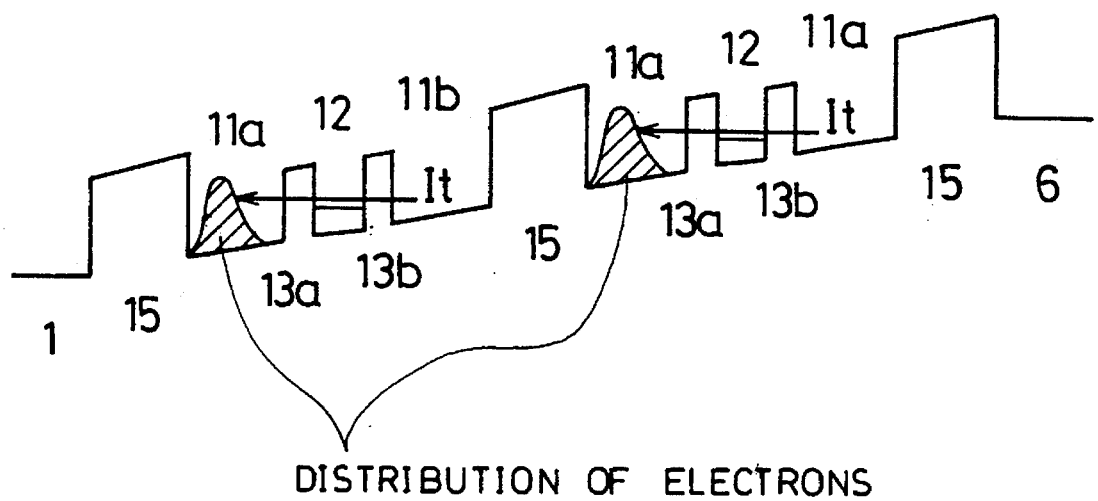
Figure 12A:
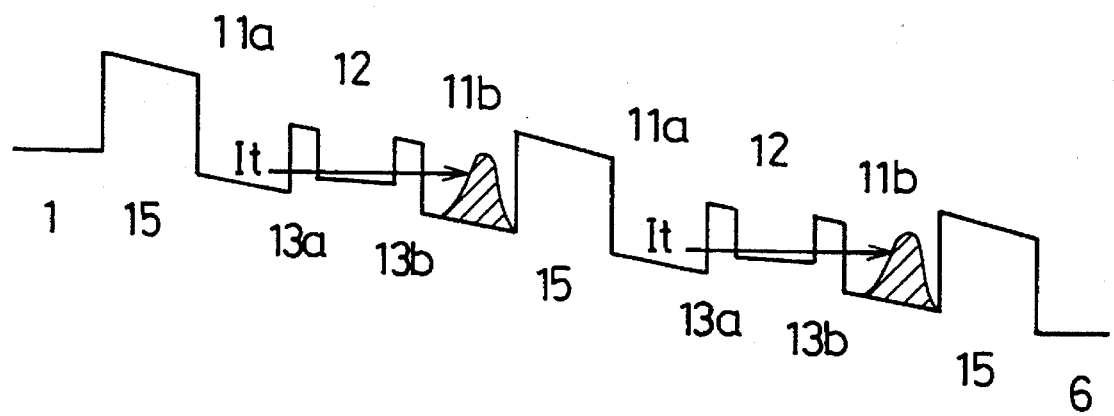
FIGS. 12(a) and (b) are explanatory views of distribution of potential energy of electrons when the electrode is applied with a positive and negative voltage in case that the low barrier regions related to the fourth example have the second structure.
Figure 12B:
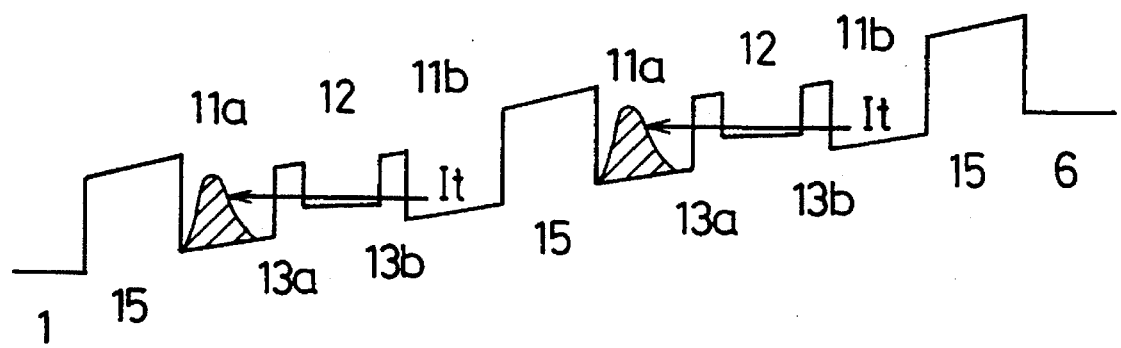

FIG. 11(a) and 12(a) show distribution of potential energy of electrons when the electrode 6 is given a certain positive potential with respect to the substrate 1. Conductive carriers existing for example in the storage region 11a flow, as indicated by the arrow in the drawings, into the storage region 11b through a first barrier region 14 (having a multi-tunneling structure comprising tunneling barriers 13a, 13b and low barrier region 12). Conductive carriers in the capacitance parts 10 are then distributed almost in the storage region 11b as shown. FIGS. 11(b) and 12(b) show distribution of potential energy of electrons when the electrode 6 is applied with a negative potential with respect to the substrate 1. In this case, the electrons existing for example in the storage region 11b do, similarly to the above, flow into the other storage region 11a through the first barrier region 14. Most of the conduction carries in the capacitance parts 10 exist locally in the storage region 11a, so that polarization occurs in the semiconductor device and can be inverted in orientation by an externally applied electric field. Orientation and extent of the polarization can be kept intact unless an electric field is applied externally. As a result, polarization in the semiconductor device and externally applied electric field have the hysteresis correlation as shown in FIG. 3, and storing information is performed by use of the hysteresis.

The semiconductor device according to the foregoing Examples 1 to 3 causes the conduction electrons to move through the plural tunneling barriers one by one, thereby enabling re-writing operation. In this Example 4, the "first and second cases" utilize the so-called "resonance tunneling" or the like phenomenon occurring when a potential energy of electrons gap between the storage regions 11a, 11b at the high potential energy side and the low barrier region 12 is almost equal to $\Delta E0$, so that the conduction electrons are caused to move through the plural tunneling barriers 13a 13b not in the manner of one by one but at a single stroke as indicated by the arrows in FIGS. 11(a) and (b) and 12(a) and (b). The function and effects will be detailed hereunder.

The curve E4 in FIG. 4 is a characteristic curve obtained from simulation of correlation between current Itunn and externally applied voltage Va in the most simple case using a single capacitance part 10 and two tunneling barriers 13a, 13b. This is the "first case" wherein the low barrier region 12 is equal to or less than de Broglie wave in thickness, the second barrier region 15 is about 6 nm in thickness, the storage regions 11a, 11b and low barrier region 12 are made of the same material and each has thickness of about 10 nm and about 6 nm, respectively, and tunneling barriers 13a, 13b of about 3 nm in thickness enabling the direct tunneling have energy gap bet of 3.2 eV. In a low voltage range wherein a potential energy of electrons gap between a storage region at high potential energy side and a low barrier region 12 is less than $\Delta E0$, the conduction electrons pass through the plural (two or more) tunneling barriers 13a, 13b one by one as indicated by the arrow in E2 of FIG. 4. Hence, the current Itunn upon data hold and reading is low substantially equal to Example 1, as seen. When an externally applied voltage increases and a potential energy gap between a storage region at high potential energy side and a low barrier region 12 is almost equal to $\Delta E0$, the conduction electrons do, at a stroke with the resonance tunneling, pass through the first barrier region 14 including the tunneling barriers 13a, 13b and low barrier region 12, as indicated by the arrow in E3 of FIG. 4, and the current Itunn increases abruptly and drastically. When the externally applied voltage is further increased, the resonance tunneling does not occur and the current Itunn decreases abruptly. A probability T that the conductive carriers pass through the first barrier region 14 with resonance tunneling is basically "1", so that it is possible to obtain a higher current value Itunn upon re-writing in comparison with the conventional art. Also, externally applied voltage necessary for re-writing and internal electric field on that occasion are notably low in comparison with the conventional art, thereby improving reliability of the semiconductor device. In the example of curve E3 in FIG. 4, the point near 3 V where abrupt increase of current Itunn due to resonance tunneling is seen may be set as a voltage range for writing and erasing, merely requiring notably low voltage to be applied externally for re-writing in comparison with 10 to 20 V in the curves E1 (characteristic of the conventional art) and E4. In case of the curve E3 in FIG. 4, a voltage range for reading may be set to ±1.5 to 2 V sufficient for practical use, in which range the current Itunn is made sufficiently low for practical use. Also in the above "second case", resonance tunneling or the like phenomenon occurs when potential energy gap between the storage region at high potential energy side and the low barrier region 12 is almost equal to $\Delta EO$, thereby obtaining the same function and effects as in the foregoing "first case". As seen, this Example with the characteristic providing the capacitance parts 10 with the multi-tunneling barriers having resonance tunneling achieves the particular effects, not found in the conventional art, as satisfying all the requirements below which are for ideal semiconductor memory referred to at the "tasks the invention resolves".

(A) Extremely high speed re-writing and erasing operation is to be possible at a relatively low voltage;

(B) The maximum number of re-writing is to be practically sufficiently achieved with high reliability;

(C) Characteristic of practically sufficiently long hold of data is to possess; and (D) A voltage range for reading is sufficiently large, and the device has no "destructive reading".

The above example has been explained with the case using two tunneling barriers. Using three or more tunneling barriers obtains the same result as the case using two tunneling barriers except that the degree of effects should be more notable or slightly complicated. Also, the essentially same conclusion will be obtained even when using other values than those in Example 4 for thickness of tunneling barriers 13a, 13b, energy gap $\Delta Et$, thickness of second barrier regions 15 and low barrier region.

In the "first case" in this Example, the more the low barrier region 12 is reduced in thickness dw, the more the quantum effects is shown notably to increase $\Delta EO$. Hence, changing dw in the "first case" and $\Delta EO$ in the "second case" enables to control the voltage range for reading operation. The low barrier region 12 when designed to be a semiconductor generally uses intrinsic, semi-insulation or high-resistant semiconductor for the purpose of restraining dispersion in tunneling to the minimum but may use a low resistant semiconductor. Furthermore, a plurality of active regions may be employed to have the same conclusion as of the above simple case using a single active region. Also, using positive holes in stead of electrons for the conductive carriers may achieve the same function and effects as above.

The semiconductor device according to this Example may be substituted for storage capacitance forming a DRAM memory cell to obtain a nonvolatile DRAM. Since the semiconductor device of this Example has self-polarization effect, an extent (or orientation) of current flowing a switching MOSFET, which is the other component for the DRAM memory cell, changes correspondingly to an extent and orientation of the polarization, which feature is made use of for reading data stored. Hence, nonvolatile DRAM according to this Example has function of self-amplification of data signals not as the conventional DRAMs, thereby enabling high speed reading. Additionally, extent and orientation of polarization provided by the nonvolatile DRAM of this Example is kept intact when applied electric field is low corresponding to reading operation or less, so that the refreshing operation as required in the conventional DRAMs is unnecessary, achieving low power consumption. Furthermore, re-writing data according to this Example has shift of conductive carriers in the barrier regions but essentially not exchange charges with an outside system, thereby enabling low power consumption in comparison with the conventional DRAMs and providing the particular merits as re-writing at high speed equal to or more than the conventional DRAMs and realizing the practically sufficient maximum number of re-writing. As seen, using the semiconductor device according to Example 4 realizes a nonvolatile DRAM enabling high speed operation with low power consumption.

EXAMPLE 5

Figure 13A:
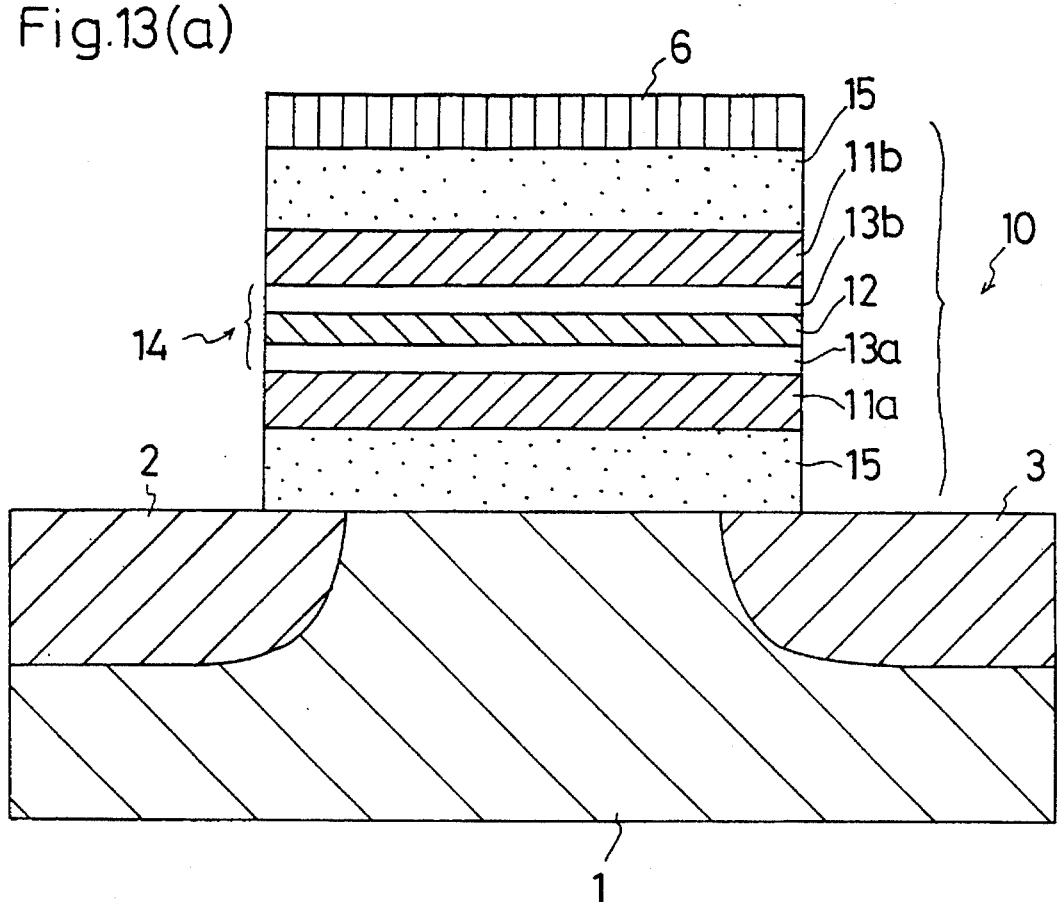
FIGS. 13(a) to (c) are a sectional view showing a essential structure of the semiconductor device related to the fifth example, and explanatory views showing distribution of potential energy of electrons with the low barrier regions having the first or second structure.

Next, Example 5 will be detailed with referring to FIGS. 13(a) and (b).

Figure 13B:
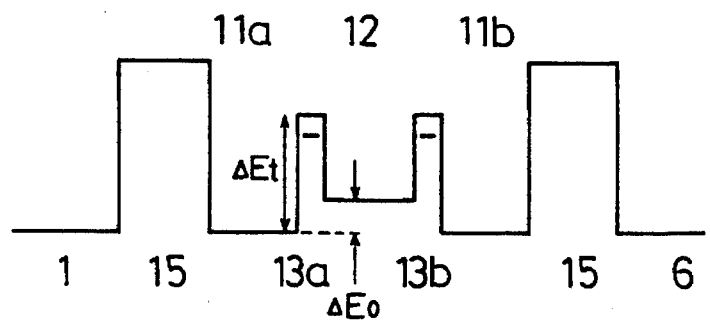

FIG. 13(a) shows a section of the structure of semiconductor including on MOSFET a capacitance part 10 having the structure explained in Example 4. FIG. 13(b) and (c) show distribution of potential energy of electrons with the capacitance part 10 structured as the "second case" and "first case" referred to in Example 4. As seen in FIG. 13(a), a single capacitance part 10 is provided on the semiconductor substrate 1, on which a gate electrode 6 is formed. Formed on the surface region of the substrate 1 below both ends of the capacitance part 10 are a source region 2 and a drain region 3 provided by introducing impurity into the substrate. The structure of capacitance part 10 is basically the same as that shown in FIG. 10(a). The conductive carrier supply 7 is formed in the tunneling barriers 13a, 13b.

Figure 13C:
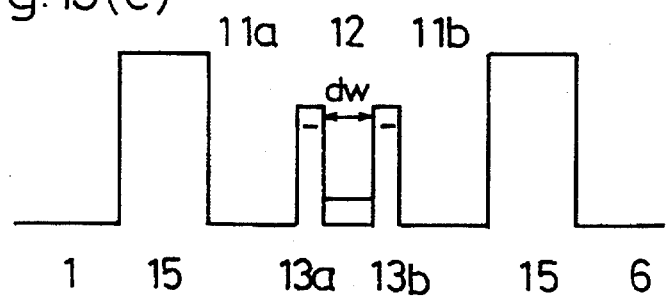

The source region 2 and drain region 3 may be the same as those used for general MISFETs and made by applying impurity atoms having reversed polarity with respect to the substrate as MOSFET using Si semiconductor. Also, the source region 2 and drain region 3 generally have the same distribution of the impurity atoms but may be different in such distribution from each other. FIGS. 13(a) to (c) exemplifies the carrier supply 7 formed in the tunneling barriers 13a, 13b. As mentioned above, the carrier supply 7 may be provided in any one, combination of two or three of, or all of the second barrier regions 15, tunneling barriers 13a, 13b, and storage regions 11a, 11b. FIG. 13(a) exemplifies the most simple feature including a single capacitance part 10 and two tunneling barriers 13a, 13b. The tunneling barriers and capacitance part may be three or more, and two or more, respectively. Using a single capacitance part has particular merits that the capacitance part has a simple structure and is favorably processed, and can be made thin enough to allow the semiconductor device to be microstructure and have integration when the capacitance part is employed in MIS type semiconductor device. For example, in the "second case" (FIG. 13(c) using the second barrier regions 15 and tunneling barriers 13a, 13b each made of SiO2 of 6 nm and 3 nm in thickness respectively, and storage regions 11a, 11b and low barrier region 12 each made of Si film of 10 nm in thickness, total thickness of the whole capacitance part 10 counted with SiO2 is merely about 28 nm.

Next, operation of MISFET according to this Example will be detailed with referring to FIG. 6. Whether the conductive carriers exist mainly in the storage region 11a or 11b in the capacitance part 10 corresponds to whether threshold voltage VT of MISFET is high threshold value VT0 or low threshold value VT1, and the drain current Id and gate voltage have hysteresis correlation as Example 2, so that storing information is performed by use of the hysteresis. The state of high threshold value VT0 and that of low threshold value VT1 are adapted to correspond to digital signals "0" and "1", so that MISFET semiconductor device according to the present Example is substituted, for example, for flash EEPROM memory cell. According to this Example, the conductive carriers which move around only in the active regions but not flow to the outside to be lost can store data stably for a long time with consuming particularly low power in comparison with conventional flash EEPROMs. In addition, writing and erasing are enabled not only at particularly higher speed but also under particularly low electric field in comparison with the conventional flash EEPROMs. Hence, the device has the merit realizing the practically sufficient maximum number of rewriting. Furthermore, conductive carriers exist in the capacitance part 10 and are distributed in two storage regions 11a, 11b in a certain ratio. According to the distribution ratio the MISFET has an intermediate threshold value VTm, shown by thin solid line in FIG. 6, between VT0 and VT1, such intermediate threshold value being utilized for storing analog signals or multivalued logic signals. The state that MOSFET has the intermediate threshold value VTm may be realized by fully shortening pulse width in writing or erasing data with respect to time required for the whole number of conduction electrons in the capacitance part 10 to move from one storage region 11a (or 11b) to the other 11b (or 11a), or by changing voltages for writing or erasing. By use of the above quality the MIS type semiconductor device according to this Example may be used for processing information as that pulse width for writing is set to allow threshold value VT to change gradually correspondingly to the number of pulse signals for writing, which feature is utilized to perform integrating.

FIG. 6 exemplifies n-channel MISFET formed on p type semiconductor substrate 1. This Example is applicable also to p-channel MISFET formed on n type semiconductor substrate 1 and provides the same function and effects as of n-channel MISFET.

Furthermore, MIS type semiconductor device according this Example is substantially similar in shape to that of Example 2 except that structure of the low barrier region 12 is modified to have film thickness or potential energy generating the resonance tunneling. Hence, the device of this Example may be manufactured by the almost same processes (not shown) as of FIGS. 7(a) to (f).

EXAMPLE 6

Figure 14:
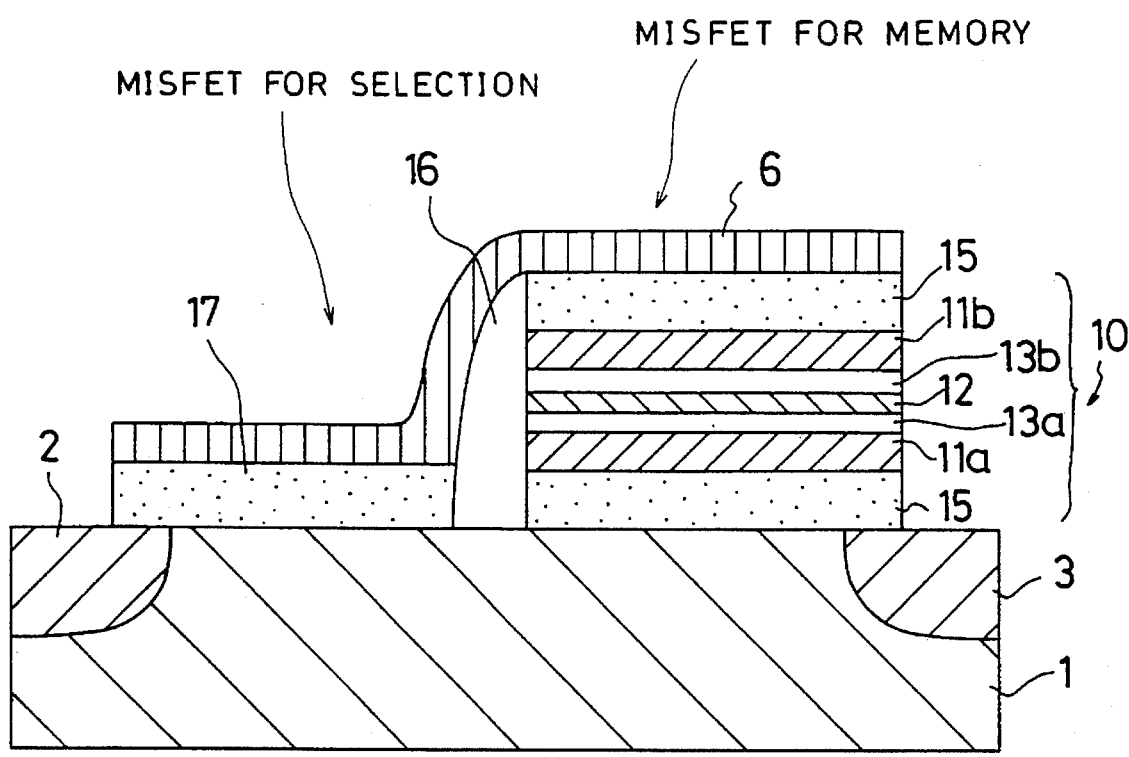
FIG. 14 is a sectional view of a semiconductor device related to the sixth example.

Next, Example 6 will be detailed with referring to FIG. 14.

FIG. 14 shows a MISFET for memory having the structure shown in Example 5 and a MISFET for selection assembled as extending in series thereto along a direction of a channel of the MISFET for memory. The part near the drain region 3 (right half in the drawing) forms MISFET having the structure shown in FIG. 13(a) and the part near the source region 2 (left half) a MISFET for selection having a gate insulator 17. The MISFETs are separated by a side wall 16 made of an insulator or semi-insulation semiconductor and have commonly the gate electrode 6. When using Si for the semiconductor substrate 1, gate insulator 17 is made of SiO2 film of 5 to 30 nm in thickness, and a side wall 16 of SiO2, Si3N4 or a composite thereof of 50 to 300 nm in lateral thickness.

The MISFET for selection is often useful for effectively preventing the so-called disturbing phenomenon that writing data in a memory cell in a semiconductor memory integrated circuit occasionally interferes an adjoining memory cell to change a state of data storage therein. Adoption of the structure shown in FIG. 14 enables both of MISFET for memory and that for selection to be provided together in a quite small area, thereby achieving integration with prevention of the disturbing. The MISFET for selection may be disposed at the side of drain with respect to the memory MISFET as shown in Example 3 (FIG. 8) or at both sides, i.e., at the sides of drain and source with respect to the memory MISFET as shown in FIG. 22 related to other Example.

MIS type semiconductor having the structure of this Example may be manufactured basically with the same processes as of FIGS. 9(a) to (d).

EXAMPLE 7

Figure 16A:
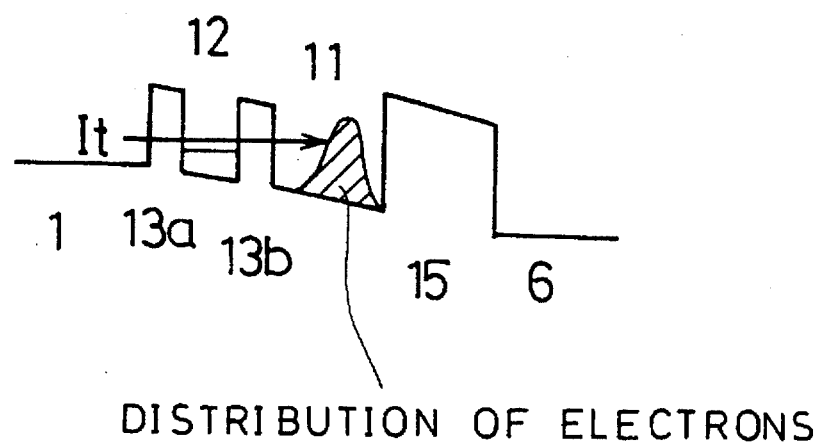
FIGS. 16(a) and (b) are explanatory views of distribution of potential energy of electrons when the electrode is applied with a positive and negative voltage in case that the low barrier regions related to the seventh example have the first structure.
Figure 16B:
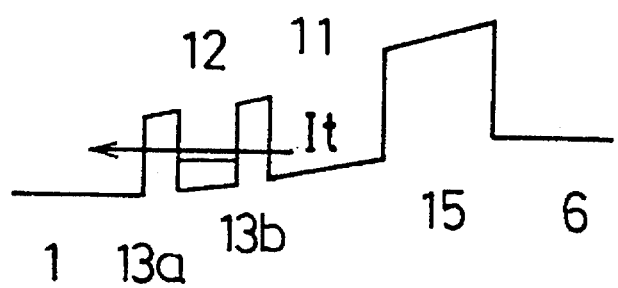
Figure 17A:
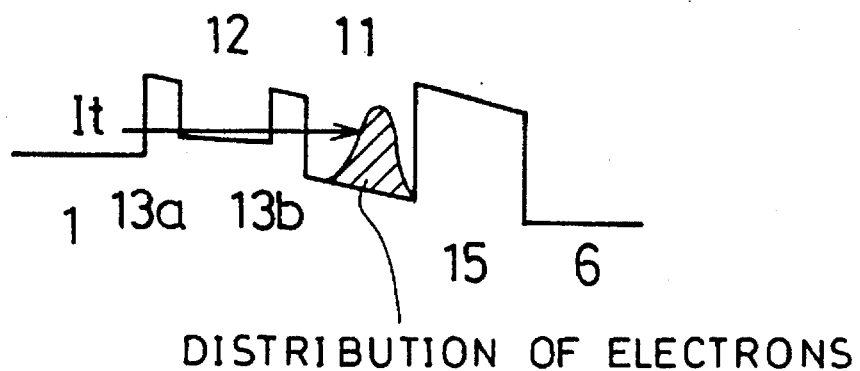
FIGS. 17(a) and (b) are explanatory views of distribution of potential energy of electrons when the electrode is applied with a positive and negative voltage in case that the low barrier regions related to the seventh example have the second structure.
Figure 17B:
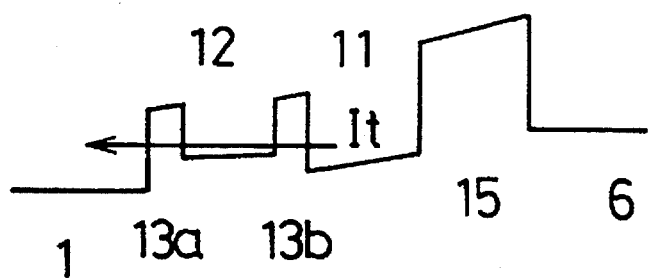
Figure 18:
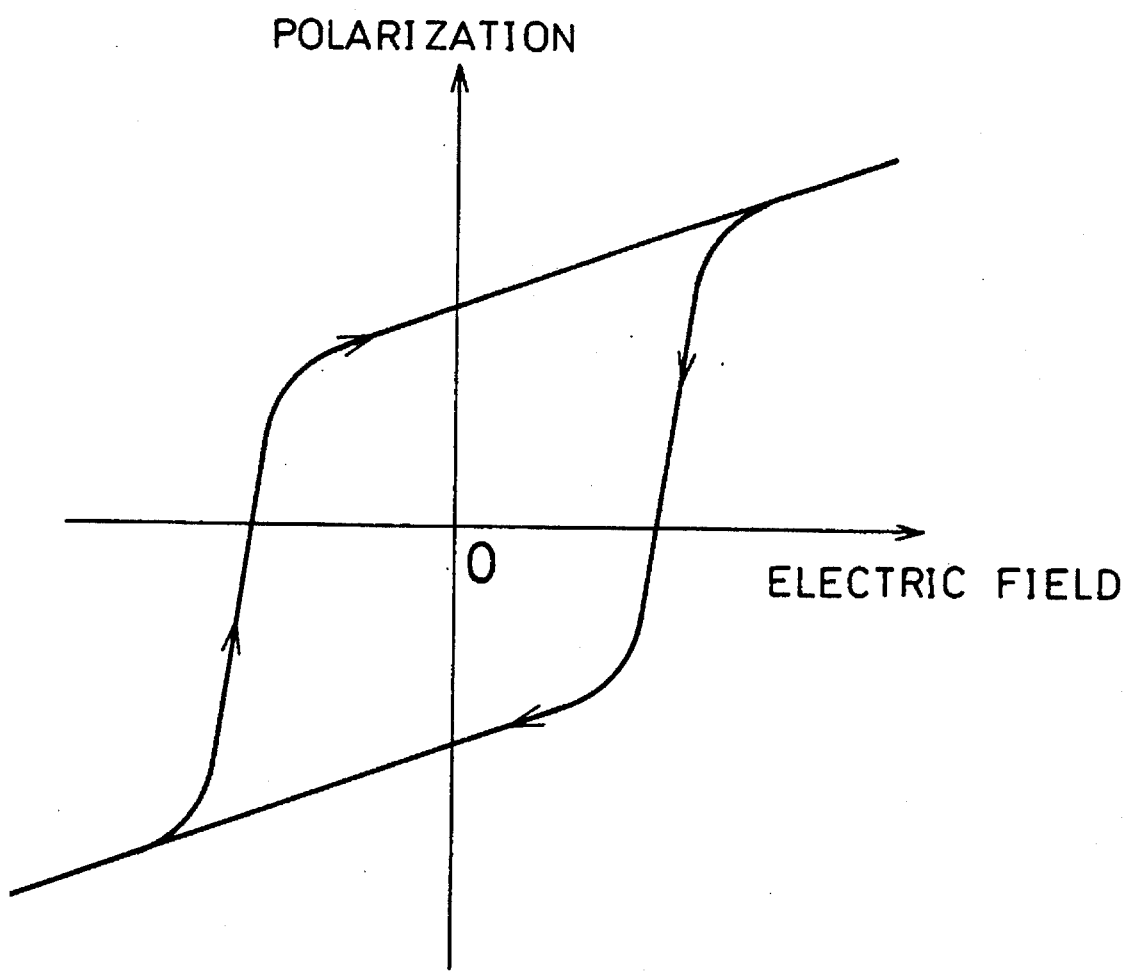
FIG. 18 is a characteristic chart showing correlation between polarization and electric fields in a semiconductor device related to the seventh example.

Next, Example 7 will be explained with referring to FIGS. 15(a) to (c), FIGS. 16(a) and (b), FIGS. 17 (a) and (b) and FIG. 18.

Figure 15A:
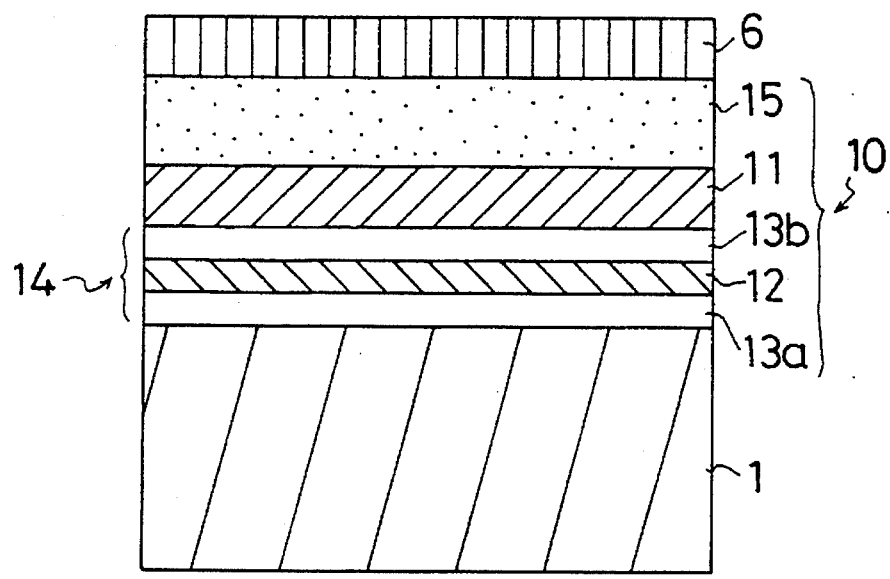
FIGS. 15(a) to (c) are a sectional view showing essential structure of the semiconductor device related to the seventh example, and explanatory views showing distribution of potential energy of electrons with the low barrier regions having the first or second structure.

FIG. 15(a) shows a sectional view of a structure of a semiconductor device having a multi-tunneling barrier according to the Example, wherein reference numeral 1 designates a semiconductor substrate (or electrode), 6 an electrode, and 10 a capacitance part interposed therebetween. In this Example, only a single storage region 11 is arranged in the capacitance part 10, as not in the above Examples, the storage region 11 adjoining at one side to a first barrier region 14 and at the other side to a second barrier region 15. The first barrier region 14 comprises two tunneling barriers 13a, 13b, and a low barrier region 12 therebetween. One tunneling barrier 13a adjoins to the substrate 1 and the second barrier region 15 adjoins to the electrode 6. The first barrier region 14 is a multi-tunneling barrier similarly to the above Examples.

Figure 15B:
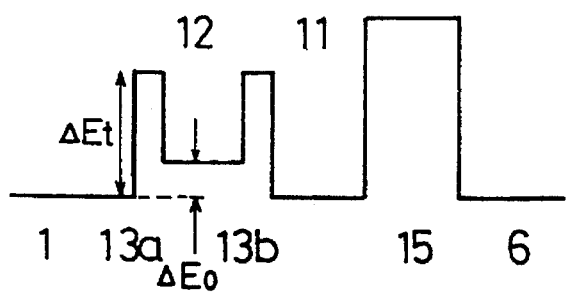
Figure 15C:
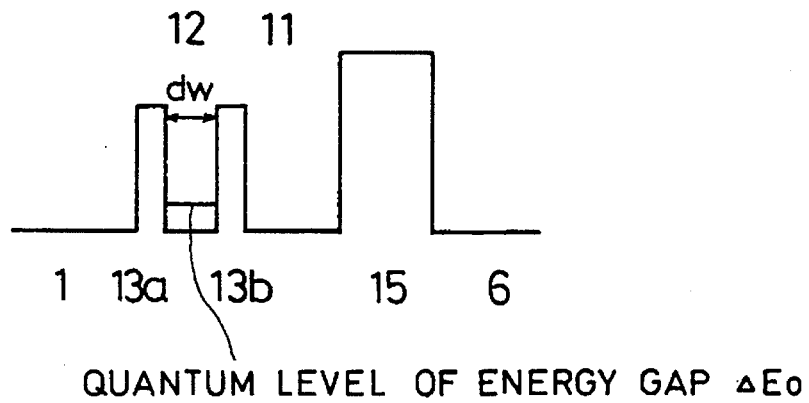

FIGS. 15(b) and (c) show distribution of potential energy of electrons in the semiconductor device, FIG. 15(b) showing the case where the low barrier region 12 has higher potential energy of electrons than the storage region 11a (this is called the "second case" similarly in explanation of Example 4), and FIG. 15(c) showing the case wherein the low barrier region 12 is equal to or less than in thickness de Broglie wave of conductive carriers (this is called the "first case" similarly in explanation of Example 4). The storage region 11 may be made of a semiconductor, a semi-insulator, or metal having lower potential energy of electrons than the second barrier region 15 and tunneling barriers 13a, 13b and is adapted to confine the conduction electrons to the inside. The tunneling barriers 13a, 13b may be made of a semi-insulation semi-conductor, semi-insulator or insulator having a higher potential energy of electrons by $\Delta Et$ than the storage region 11 and are set in the energy gap $\Delta Et$ and film thickness to be high and thin enough to allow electrons to move between the adjoining low potential energy regions mainly through tunneling effect but not by thermal excitation. Low barrier region 12 may be made of intrinsic or semi-intrinsic semiconductor, semi-insulator or insulator, has lower potential energy of electrons than the second barrier region 15 and tunneling barriers 13a, 13b, and also is equal to or less than in thickness dw de Broglie wave of conductive carriers (about 10 nm in case of electrons) in the "first case" and is higher by ΔEO in potential energy of electrons than the storage region 11 or substrate 1 in the "second case". When thickness of the region sandwiched between the energy barriers is equal to or less than de Broglie wave of conduction wave in the "first case", the low barrier region 12 forms the so-called quantum well having standing-wave and makes therein quantum level of energy gap ΔEO. The low barrier region 12 may satisfy the conditions in both the "first and second cases" at a time.

Concrete examples of combination of materials for the tunneling barriers 13a, 13b and storage region 11 include AlAs and GaAs, SiO2 and Si, GaAlAs and GaAs, SiO2 and SiC, Si3N4 and Si, GaAlN and GaN, or Si and SiGe. Generally, the plurality of tunneling barriers 13a, 13b often use the same material and have the same film thickness but may use different materials and be different in film thickness from each other. Also, the tunneling barriers 13a, 13b and second barrier region 15 may be different or equal in potential energy of electrons from or to each other and use the same materials.

In the "first case", low barrier region 12 and storage region 11 may be different in potential energy of electrons but may be equal in potential energy thereof to each other and may be made of the same material. For example, the second barrier regions 15 are made of SiO2 of 5 to 30 nm in thickness, tunneling barriers 13a, 13b of SiO2 of 2–5 nm in thickness, and the low barrier region 12 and storage regions 11a, 11b of Si of 2 to 10 nm and of 5 to 30 nm in thickness, respectively. In the "second case", concrete examples of combination of materials for the tunneling barriers 13a, 13b and low barrier region 12 forming the first barrier region 14 include AlAs and AlGaAs, SiO2 and Si, AlAs and GaAs, SiO2 and SiC, SiO2 and Si3N4, Si3N4 and Si, AlN and GaAlN, or Si and SiGe. In this case, for example, the second barrier regions 15 are made of SiO2 of 5 to 30 nm in thickness, tunneling barriers 13a, 13b of SiO2 of 2–5 nm in thickness, and the low barrier region 12 and storage regions 11 of SiC and Si of 5 to 30 nm in thickness, respectively.

The conductive carriers to be confined to the storage region 11 in the above feature are electrons but may use positive holes.

In FIG. 15(a) exemplified is the case using two tunneling barriers 13a, 13b. The capacitance part 10 may include at least two or more, for example, three, four or more, for example, ten tunneling barriers with the tunneling barrier and low barrier region increasing one at a time whenever the tunneling barrier is increased one at a time.

Next, operation of the semiconductor device according to Example 7 will be detailed. Conductive carriers (electrons in this case) existing inside the semiconductor substrate 1 shown in FIG. 15(a) are fed into the storage region 11 by applying an electric field of extent more than a predetermined value so as to store charges in the storage region 11, so that information can be written and stored corresponding to the specific amount of charges stored in the storage region 11. The conductive carriers once fed and confined to the storage region 11 do not go over the second barrier region 15 or the plurality of tunneling barriers 13a, 13b, i.e., not to flow out to the outside and be lost through thermal excitation unless a predetermined extent or more of electric field is applied, thereby enabling information to be held and stored. Furthermore, a predetermined voltage may be applied between the semiconductor substrate 1 and the electrode 6 to change and control (re-write) the contents of information stored. It will be detailed with referring to FIGS. 16(a) and (b) and FIGS. 17(a) and (b). When the electrode is given a certain positive potential with respect to the substrate 1, conductive carriers existing in the substrate 1 flow into the storage region 11 through the first barrier region 14 (having a multi-tunneling structure comprising the tunneling barriers 13a, 13b and low barrier region 12) as shown in FIGS. 16(a), (b) and FIGS. 17(a), (b) (See the arrow in the drawing) and are locally distributed inside the storage region 11 as shown. When the electrode 6 has a negative potential with respect to the substrate 1, the electrons existing in the storage region 11 are moved to the substrate 1 through the first barrier region 14 as seen in FIGS. 16(a), (b) and 17(a), (b), leading to that the storage region 11 have little electrons. As a result, the hysteresis correlation between polarization and externally applied electric field in the semiconductor device of this Example is, as shown in FIG. 18, reverse to the hysteresis characteristic shown in FIG. 3, and is utilized to store information.

The semiconductor device according to Examples 1 to 3 uses for re-writing data the conductive carriers+ movement one by one at a time through the plural tunneling barriers as foregoing. In the "first and second cases" in this Example, when potential energy gap between any one of the storage region 11 and substrate 1 having a higher potential energy and the low barrier region 12 is almost equal to ΔEO to cause the so-called tunneling or the like phenomenon similarly to Example 4, the conductive carriers pass through the plurality of tunneling barriers 13a, 13b not one by one but at a single stroke. Hence, the device of this Example shows the same Itunn-Va characteristic as the curve E3 in FIG. 3 and provides the same function and effects as of Example 4. In detail, probability T that the carriers pass through the first barrier region 14 through tunneling is basically "1", so that it is possible to obtain higher current Itunn for re-writing in comparison with the conventional art. Also, externally applied voltage and internal electric field required upon re-writing are notably lower than the conventional art, thereby improving reliability of the semiconductor device. For example, in this Example, abrupt increase of current Itunn due to resonance tunneling is observed at about 3 V, which values are set as an operation voltage range for writing and erasing. In comparison with voltage 10 to 20 V required by the characteristic curves E1 and E4 related to the conventional arts, the externally applied voltage required for writing in this Example is extremely low. On the other hand, a reading operation voltage range can be set to ±1.5 to 2 V as practically sufficient, wherein the current It can be made low practically sufficiently. Also in the "second case" in this Example, when potential energy gap between the storage region 11 having a higher potential energy of electrons and the low barrier region 12 is almost equal to ΔEO to cause the so-called tunneling or the like phenomenon, the same function and effects as in the "first case" can be obtained. As seen, this Example has the particular effects not found in the conventional art as satisfying, with the characteristic providing the multi-tunneling barrier having resonance tunneling in the capacitance 10, all the requirements (A) to (D) for ideal semiconductor memory referred to in the tasks the invention solves.

The above explanation has been made with the case using two tunneling barriers 13. The essentially same conclusion will be given with using three or more tunneling barriers with the quality mentioned above being more or less notably or complicated.

In the "first case" in this Example, the more the thickness dw of low barrier region 12 is made low, the more the quantum effects is shown notably to increase ΔEO. Hence, changing the thickness dw of low barrier region 11 in the "first case" and energy gap ΔEO in the "second case" enables to control the operation voltage ranges for re-writing and reading.

When using a semiconductor for the low barrier region 12, the semiconductor may be intrinsic, semi-insulation or high resistant for the purpose of minimizing dispersion in the tunneling operation. The low barrier region 12 may be made of a low resistant semiconductor. Also, using positive holes instead of electrons for the conductive carriers achieves the same function and effects as above.

EXAMPLE 8

Next, Example 8 will be detailed with referring to FIGS. 19, 20 and 21(a) to (f).

Figure 19:
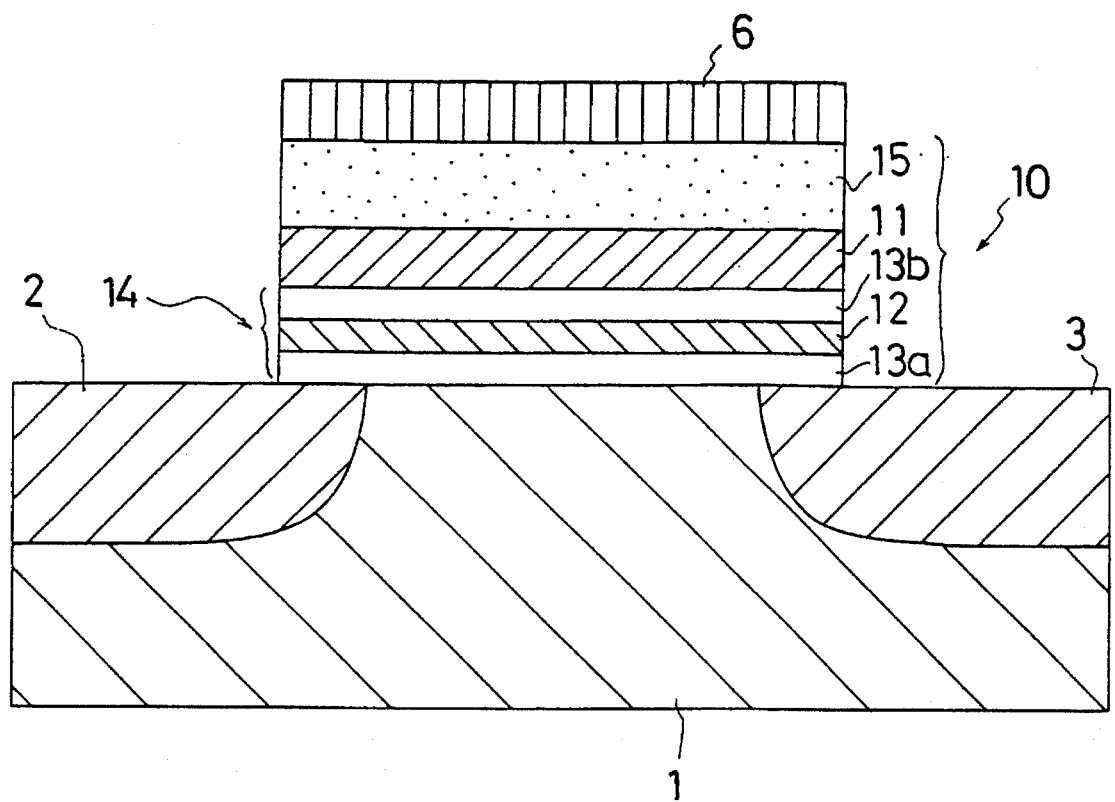
FIG. 19 is a sectional view of a semiconductor device related to the eighth example.

FIG. 19 shows a section of structure of a semiconductor including on MISFET a capacitance part 10 structured as Example 7, wherein on the semiconductor substrate 1 is provided the capacitance part 10 on which a gate electrode 6 is formed. A source region 2 and a drain region 3 are formed on the surface region of the substrate 1 below both ends of the capacitance part 10 by applying impurities into the semiconductor substrate 1. Structure of the capacitance part 10 is substantially same as that shown in FIG. 15(a). The source and drain regions 2 and 3 may use those used in the general MISFET or be made by using impurity atoms of reversed polarity with respect to the semiconductor substrate as in the MOSFET using Si semiconductor.

The source region 2 and drain region 3 are generally identical in impurity atoms distribution to each other but may be different in this regard to each other. FIG. 19 shows the most simple case using two tunneling barriers 13a, 13b, but three or more tunneling barriers can be provided. Using two tunneling barriers enables the capacitance part 10 to have a simple structure and be favorably processed, and also enables the capacitance part to be made thin enough to allow the semiconductor device to be microstructure and have integration when MIS type semiconductor device uses the capacitance part 10 in place of an insulator or semi-insulator. In the "second case" in this Example, when the second barrier region 1 and tunneling barriers 13a, 13b are made of SiO2 of 6 nm and 3 nm in thickness respectively, and the storage region 11 and low barrier region 12 made of Si film of 10 nm in thickness, thickness of the whole barrier region counted with SiO2 is required to be merely about 19 nm with using a single active region.

Next, operation of the MIS type semiconductor device according to the present Example will be explained with referring to FIG. 20. Whether the conductive carriers exist or not inside the storage region 11 corresponds to whether threshold voltage VT of MISFET shows high threshold value VT0 or low threshold value VT1. That is, similarly to Example 2, the drain current Id and gate voltage Vg have the hysteresis correlation characteristic which may be utilized to store information. MISFET according to the present Example has the hysteresis characteristic reverse to Id-Vg characteristic shown in FIG. 6, similarly to the case of correlation between polarization and electric field shown in FIG. 18. The states that threshold value VT shows high value VT0 and low value VT1 are adapted to correspond to digital signals "0" and "1" for substituting the MIS type semiconductor of this Example, for example, for flash EEPROMs memory cell. The device of this Example has the particular merits enables writing and erasing at particularly higher speed and with particularly lower electric field and the practically sufficient maximum number of re-writing data stored in comparison with the conventional flash EEPROMs. Although this Example does not have the merit as in Example 5 that there is essentially no shift of charges between the capacitance part 10 and external regions, the device of this Example is enabled to re-write data with particularly low voltage in comparison with the conventional flash EEPROMs, thereby requiring further less power consumption to this extent. Furthermore, in comparison with Example 5, the number of each of storage region 11 and second barrier region 15 is reduced by one, and the conductive carriers can be readily fed into the capacitance part 10 without provision of the conductive carrier supply 7 inside the capacitance part, leading to a further simple structure of the device favorably processed.

Figure 20:
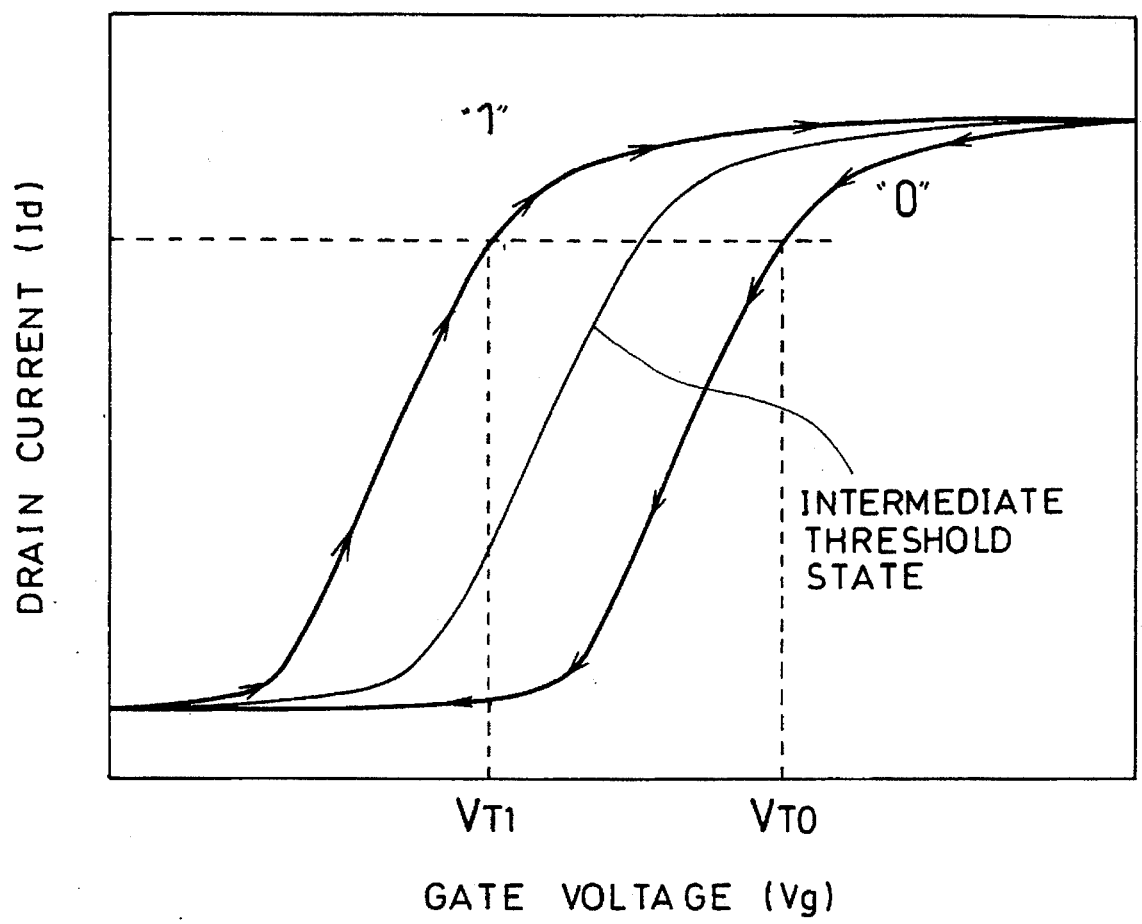
FIG. 20 is a characteristic chart showing correlation between drain current Id and gate voltage Vg in a semiconductor device related to the eighth example.

When charges in the storage region 11 are in an amount in a certain ratio with respect to the state showing high threshold value VT0, the MISFET has an intermediate threshold value VTm between VT0 and VT1, shown by thin solid line in FIG. 20, depending on that ratio, which intermediate threshold value may be used for storing analog signals or multivalued logic signals. The state showing the intermediate threshold value VTm can be realized by fully shortening pulse width upon writing or erasing in comparison with time required for the whole number of electrons in the capacitance part 10 to pass through the second barrier region 14 having the multi-tunneling structure, or by changing voltage for writing or erasing. Also, by using the above quality, the MIS type semiconductor device according to this Example may be used for processing information, for example, pulse width for writing Is set to allow threshold value VT to gradually change depending on the number of pulses for writing, which feature is made use of for integrating process.

FIG. 20 shows n-channel MISFET formed on p type semi-conductor substrate 1. The device may be applicable to p-channel MISFET formed on n type semiconductor substrate 1, having the same function and effects as the above n-channel MISFET.

Manufacturing method of MIS type semiconductor device according to the Example will be next detailed with referring to FIGS. 21(a) to (f).

Figure 21A:
FIGS. 21(a) to (f) are sectional views showing a changing structure of the semiconductor device in manufacture related to the eighth example.
Figure 21B:
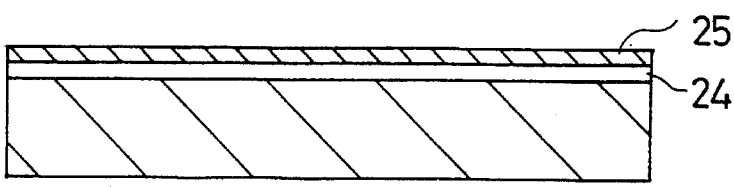
Figure 21C:
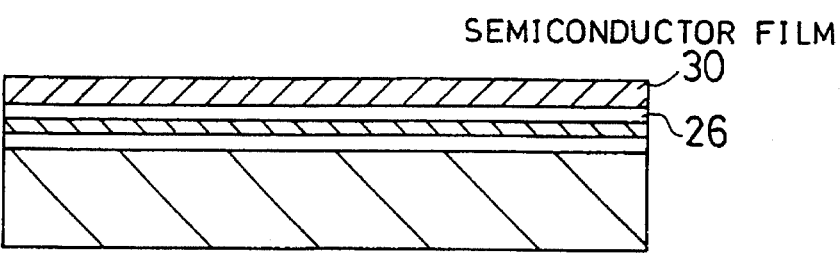
Figure 21D:
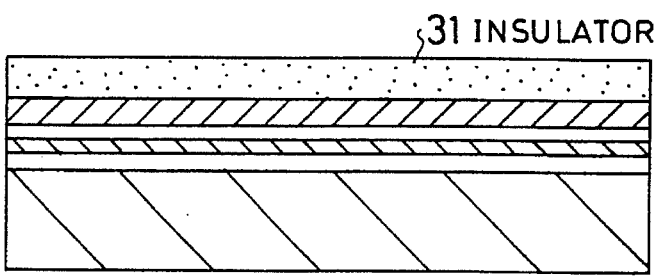
Figure 21E:
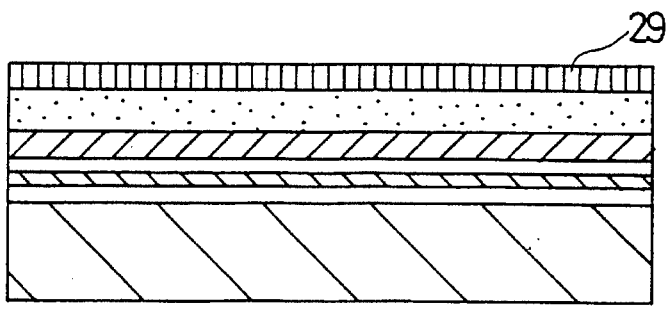

First, on the semiconductor substrate 1 (or metal substrate or film) is formed, for example, by general thermal oxidation, a first insulator 24 of SiO2 of about 3 nm in thickness (FIG. 21(a)). A semiconductor film 25 made of amorphous Si of about 6 nm in thickness and semi-insulation or high resistant is formed, for example, by CVD (FIG. 21(b)). Then, the semi-insulation semiconductor film 25 is oxidized at low temperature to form a second tunneling insulator 26 of SiO2 of about 3 nm in thickness, on which formed a semiconductor film 30 of amorphous Si of about 10 nm in thickness (FIG. 20(c)).

An insulator 31 of SiO2 of about 8 nm in thickness is then formed by CVD on the film 30 (FIG. 20(d)), on which formed is polycrystalline Si film 29 of 300 nm in thickness by doping phosphorus (P) by CVD (FIG. 20(e)).

When required, the processes for forming the second tunneling insulator 26 and semiconductor film 30 are repeated several time.

After forming a composite film on the semiconductor substrate by the above processes, patterning for providing the gate electrode and capacitance part Is carried out, followed by ion implantation of arsenic (As) using the patterned composite as a mask to form the source region 2 and drain region 3 in a self-matching manner, on which a source electrode 4 and drain electrode 5 of Al film of about 800 nm in thickness is selectively formed, for example, by vapor deposition (FIG. 20 (f)).

Figure 21F:
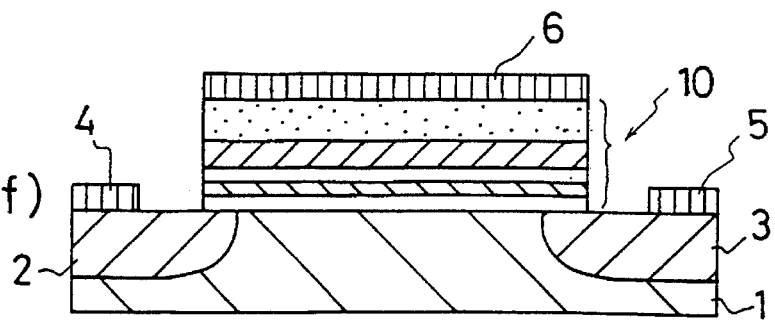

Finally, as shown in FIG. 21(f), the first and second tunneling insulators 24, 26 make the tunneling barriers 13a, 13b, the semi-insulation semiconductor film 25 the low barrier region 12, the semiconductor film 30 the storage region 11, the insulator 31 the second barrier region 15, and the polycrystalline Si film 29 the gate electrode 6.

The first tunneling insulator 24, second tunneling insulator 26 and insulator 26 may be made of silicon nitride oxide, silicon nitride or composite thereof other than SiO2. When required, the semi-insulation semi-conductor film 25 may be thicker by about 10 to 30 nm, or may employ a semiconductor film of amorphous SiC, etc., the material having higher potential energy of electrons than the substrate 1 or semiconductor film 30. Also, the whole processes may be carried out in reverse order.

EXAMPLE 9

Next, Example 9 will be detailed with referring to FIGS. 22 and 23(a) to (d).

FIG. 22 shows a section of structure of MIS type semiconductor device including MISFET having the structure shown in FIG. 19 of Example 8 and a MISFET for selection arranged in series to and along a direction of a channel of the MISFET for memory. That positioned centrally of the channel region is the MISFET for memory having FIG. 19 structure and both sides thereof near the drain 3 and source 2 form the MISFET for selection having the gate insulator 17a, 17b. The MISFETs are separated by side walls 16a, 16b made of insulator or semi-insulation semiconductor but have commonly the gate electrode 6. When using Si for the semiconductor substrate 1, the gate insulators 17a. 17b may be made of SiO2 film of 5 to 30 nm in thickness, and side walls 16a, 16b of SiO2, Si3N4, or composite thereof, about 50 to 300 nm in lateral thickness. The MISFET for selection is often useful for effectively preventing the so-called disturbing phenomenon that re-writing data stored in a memory cell in a semiconductor memory integrated circuit interferes an adjoining memory cell to change the state of storing data therein. Using the structure shown in FIG. 19 enables both the MISFETs to be included in a quite small space, thereby achieving large scale integration and prevention of the disturbing phenomenon. The MISFET for selection may be disposed at the side of drain with respect to the MISFET for memory as shown in FIG. 8, or at the side of source with respect to the same as shown in FIG. 14.

The semiconductor device of this Example may be substituted for storage capacitance forming a DRAM memory cell, thereby providing nonvolatile DRAM. In this case, since the semiconductor device has self-polarization effect, an extent (or orientation) of current flowing the switching MOSFET, which is the other component for DRAM memory cell, changes corresponding to orientation and extent of the polarization, which quality is used for reading stored data. Hence, nonvolatile DRAM according to the present Example has function of self-amplification of data signals not as in the conventional DRAMs, thereby enabling further higher speed reading data. Also, since extent and orientation of polarization of nonvolatile DRAM of this Example is kept intact when applied voltage is low electric field for reading operation or less, the device does not require the refreshing data as in the conventional DRAMs, thereby achieving low power consumption. Furthermore, the device according to this Example enables re-writing at speed equal to or higher than the conventional DRAMs, and also achieving the practically sufficient maximum number of re-writing. As seen, using the semiconductor device according to this Example has the particular merit realizing nonvolatile DRAMs usable at high speed and with low power consumption.

Next, manufacturing method for MIS type semiconductor device according to this Example will be detailed with referring to FIGS. 23(a) to (d).

After performing the same processes as FIGS. 21(a) to (d) in Example 8, the following processes will be carried out in the Example.

Figure 23A:
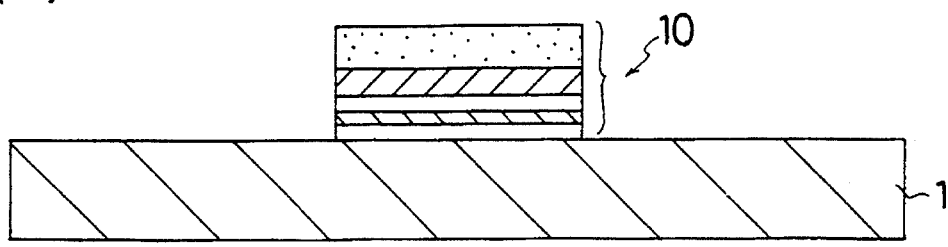
FIGS. 23(a) to (e) are sectional views showing a changing structure of the semiconductor device in manufacture related to the ninth example.
Figure 23B:
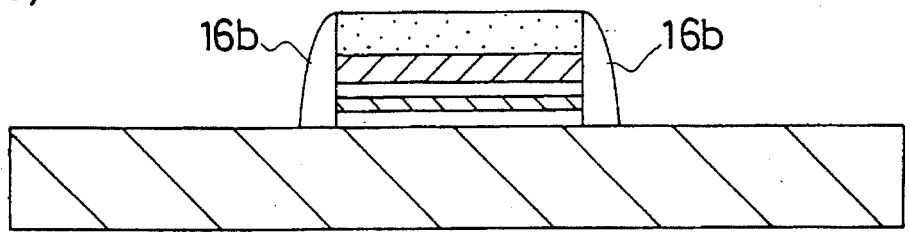
Figure 23C:
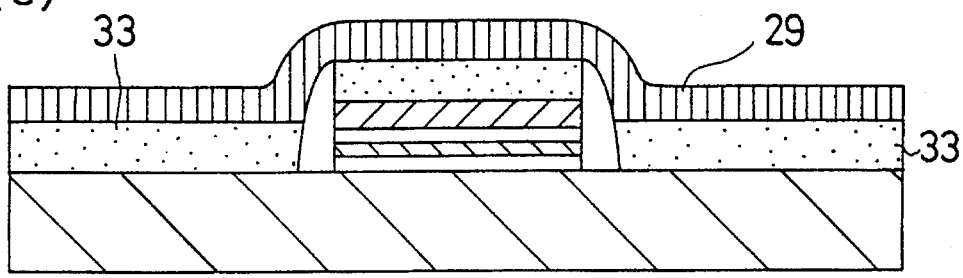
Figure 23D:
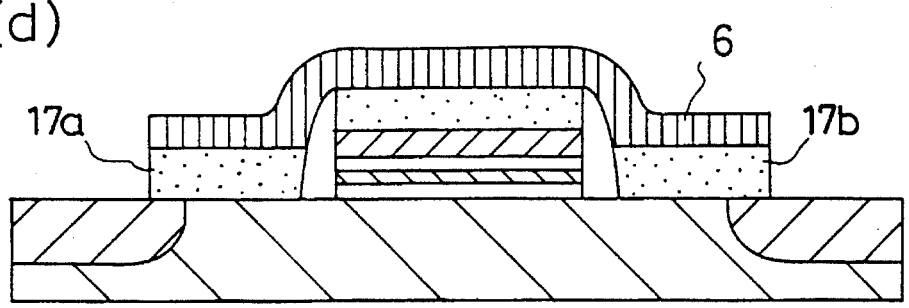
Figure 23E:
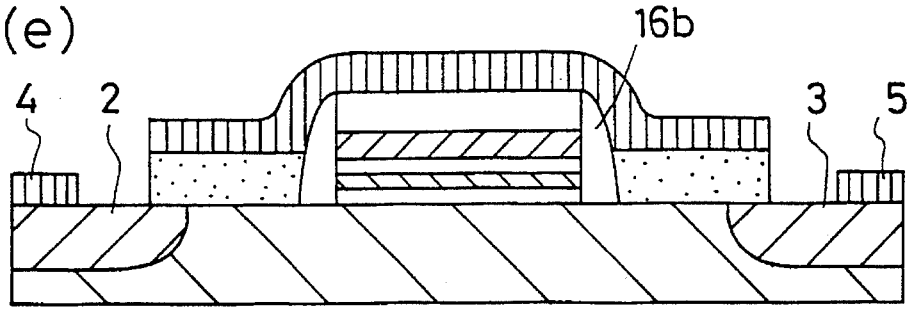
Figure 24:
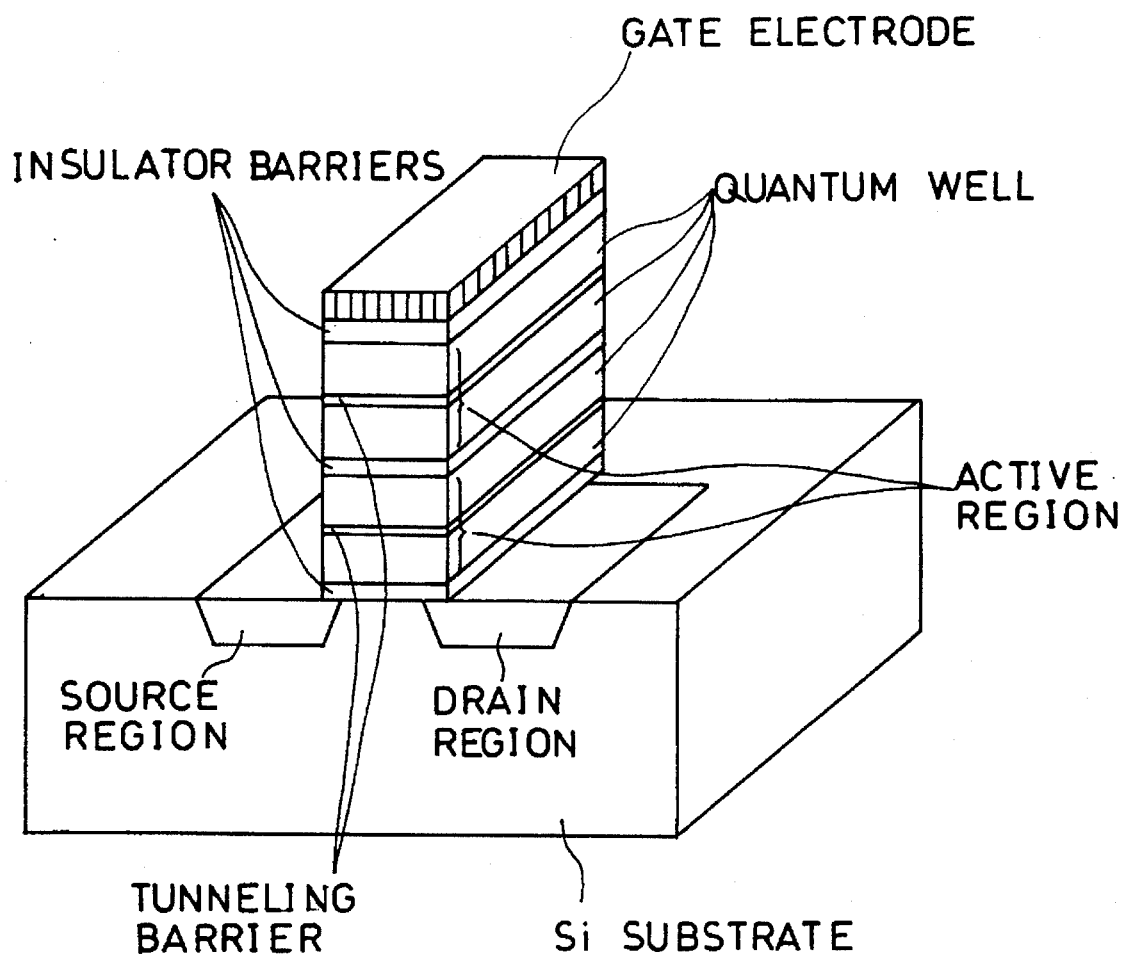
FIG. 24 is a perspective view schematically showing a conventional semiconductor device disclosed in a publication.
Figure 25:
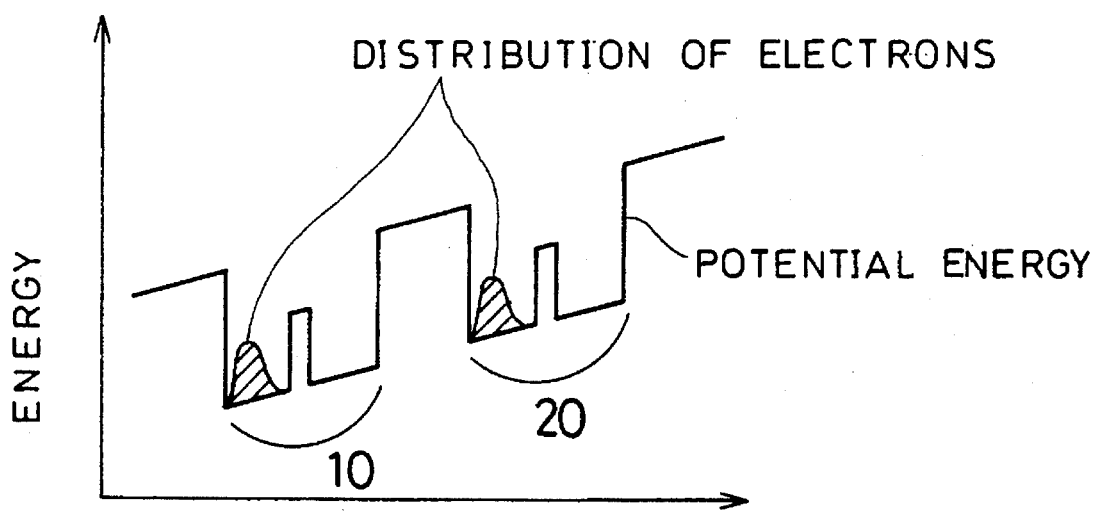
FIGS. 25(a) and (b) are explanatory views showing distribution of potential energy of electrons in a conventional semiconductor device disclosed in a publication.
Figure 25:
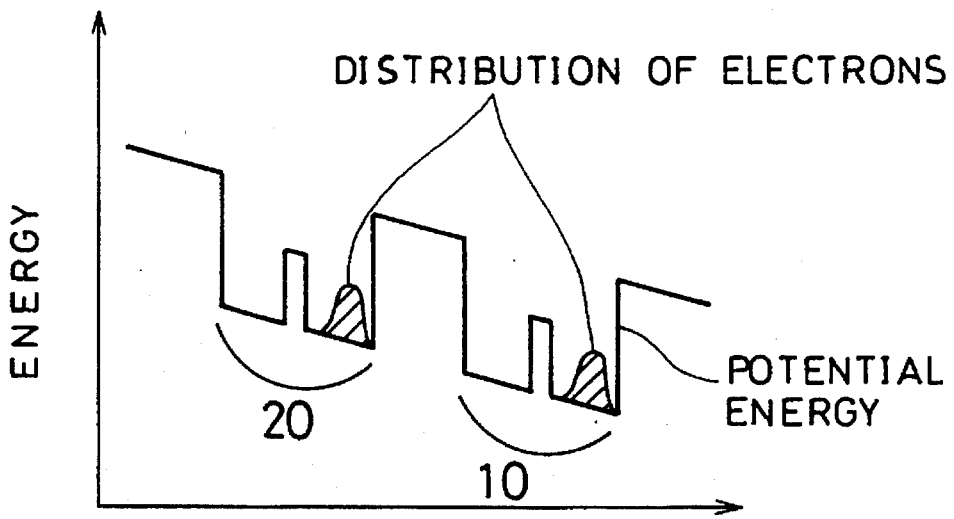

By using the general exposure to light and etching processes, a part of the composite including films from the first tunneling film 24 to insulator 31 is first removed to make patterning for the capacitance part 10 (FIG. 23(a)). Next, an insulator of SiO2 of about 10 nm in thickness is formed on the whole surface, for example, by CVD, followed by isotropic etching to form side walls 16a, 16b at both sides of the patterned capacitance part 10 (FIG. 23(b)). On the part of semiconductor substrate 1 exposed and not covered by the patterned capacitance part and side walls is formed an insulator 33 of SiO2 of about 10 nm in thickness by thermal oxidation, followed by CVD depositing on the whole surface polycrystalline Si film 29 of about 300 nm in thickness applied with phosphorus (P) (FIG. 23 (c)).

A part of the composite including both the gate insulators 33 in the capacitance part 10 and polycrystalline Si film 29 is removed by exposure to light and etching processes, followed by ion-implantation of arsenic (As) using the patterned composite as a mask to form the source region 2 and drain region 3 in a self-matching manner, and further, a source electrode 4 and drain electrode 5 made of Al film of about 800 nm in thickness are electively formed, for example, by vapor deposition. (FIG. 23 (d)).

It will be appreciated that MIS type semiconductor device having the structure shown in FIG. 22 may be readily formed by the above processes.

What is claimed is:

1. A semiconductor device, comprising:
   a semiconductor substrate; and
   at least one conductive carrier storage part for storing conductive carriers,
      wherein the conductive carrier storage part includes:
      at least two barrier regions having a high energy level to give resistance against transfer of the conductive carriers; and
      at least one storage region disposed between the barrier regions and having a low energy level to allow the conductive carriers to exist stably, and
      at least one of the barrier regions having a multi-tunneling structure which comprises,
         at least two tunneling barriers having an energy level allowing the conductive carriers to pass through the tunneling barriers by means of resonance tunneling, and
         at least one low barrier region disposed between the tunneling barriers and having a lower energy level than the tunneling barriers, said low barrier region resulting in an incident wave from one tunneling barrier and a reflected wave from another tunneling barrier being in phase with each other.

2. A semiconductor device as set forth in claim 1, wherein the storage region provided in the conductive carrier storage part is one and the barrier regions are two, and one of the two barrier regions has the multi-tunneling structure, while the other does not.

3. A semiconductor device as set forth in claim 2, wherein the conductive carrier storage part is formed on the semiconductor substrate, on which provided is one source/drain region formed on a surface region of the substrate and at least partially adjoining to the conductive carrier storage part and an electrode formed on the conductive carrier storage part, so that storing and processing information is carried out corresponding to the amount of conductive carriers existing in the storage regions of the conductive carrier storage part.

4. A semiconductor device as set forth in claim 2, wherein the conductive carrier storage part is formed on the semiconductor substrate, on which provided are two source/drain regions formed below near both ends of the conductive carrier storage part and a gate electrode formed on the conductive carrier storage part, so that storing and processing information is performed corresponding to the amount of conductive carriers existing in said one storage region of the conductive carrier storage part.

5. A semiconductor device as set forth in claim 1, wherein the storage regions provided in the conductive carrier storage part are two and the barrier regions are three, and at least the barrier region between the storage regions has the multi-tunneling structure.

6. A semiconductor device as set forth in claim 5, wherein two barrier regions adjacent to surfaces of the storage regions opposed to their surfaces facing with each other do not have the multi-tunneling structure.

7. A semiconductor device as set forth in claim 5, wherein a carrier supply is provided in the conductive carrier storage part.

8. A semiconductor device as set forth in claim 5, wherein the conductive carrier storage part is formed on the semiconductor substrate, on which provided are one source/drain region formed on the surface region of the substrate and at least partially adjoining to the conductive carrier storage part and an electrode formed on the conductive carrier storage part, so that storing and processing information is carried out corresponding to the distribution ratio of conductive carriers into the two storage regions in the conductive carrier storage part.

9. A semiconductor device as set forth in claim 5, wherein the conductive carrier storage part is formed on the semiconductor substrate, there are provided two source/drain regions formed below near both ends of the conductive carrier storage part and a gate electrode formed on the conductive carrier storage part, so that storing and processing information is performed corresponding to the distribution ratio of conductive carriers into the two storage regions in the conductive carrier storage part.

10. A semiconductor device as set forth in claim 9, wherein the storage regions and low barrier region are made of amorphous Si thin film.

11. A semiconductor device as set forth in claim 1, wherein the low barrier region in the barrier region having the multi-tunneling structure is made of a thin film material having thickness equal to or lower than de Broglie wave of conductive carriers.

12. A semiconductor device as set forth in claim 1, wherein the low barrier region in the barrier region having the multi-tunneling structure is made of a thin film material having an energy level higher than that of said at least one storage region by a predetermined value.

13. A semiconductor device as set forth in claim 1, wherein the conductive carrier storage part is formed on the semiconductor substrate, on which provided is one source/drain region formed on a surface region of the substrate and at least partially adjoining to the conductive carrier storage part and an electrode formed on the conductive carrier storage part, so that the conductive carrier storage part functions as a memory part.

14. A semiconductor device as set forth in claim 1, wherein the conductive carrier storage part is formed on the semiconductor substrate, there are provided two source/drain regions formed below near both ends of the conductive carrier storage part and a gate electrode formed on the conductive carrier storage part, so that the conductive carrier storage part functions as a memory part.

15. A semiconductor device as set forth in claim 14, wherein at least one of the two source/drain regions is spaced from the conductive carrier storage part to have a predetermined gap, and there are provided at the side of the conductive carrier storage part spaced from the source/drain region having the predetermined gap therebetween an insulator side wall thinner than the size of the gap, a gate insulator formed on the semiconductor substrate from the dielectric side wall to the source/drain region, and a gate electrode on the gate insulator, and the gate electrode is made of a conductive material which is commonly used for the gate electrode on the conductive carrier storage part.

16. A semiconductor device as set forth in claim 1, wherein the semiconductor device is a DRAM memory cell having a MIS transistor composed of a gate and source/drain regions; a capacitance electrode connected to one of the source/drain regions of the MIS transistor; a plate electrode; and a capacitance insulator film interposed between the capacitance electrode and the plate electrode, and the conductive carrier storage part is the capacitance insulator film.

17. A semiconductor device as set forth in claim 1, wherein said tunneling barriers in the conductive carrier storage part are made of $SiO_2$ thin film, and said at least one storage region and low barrier region in the conductive carrier storage part are made of Si thin film.

18. A semiconductor device as set forth in claim 1, wherein said tunneling barriers in the conductive carrier storage part are made of $Si_3N_4$, and said at least one storage region and low barrier region are made of Si thin film.

19. A semiconductor device as set forth in claim 1, wherein said tunneling barriers in the conductive carrier storage part are made of AlAs thin film, and said at least one storage region and low barrier region in the conductive carrier storage part are made of GaAs thin film.

20. A semiconductor device as set forth in claim 1, wherein said tunneling barriers are made of GaAlAs, and said at least one storage region and low barrier region are made of GaAs.

21. A semiconductor device as set forth in claim 1, wherein said tunneling barriers in the conductive carrier storage part are made of $SiO_2$ thin film, and said at least one storage region and low barrier region in the conductive carrier storage part are made of SiC thin film.

22. A semiconductor device as set forth in claim 1, wherein said tunneling barriers in the conductive carrier storage part are made of GaAlN thin film, and said at least one storage region and low barrier region in the conductive carrier storage part are made of GaN thin film.

23. A semiconductor device as set forth in claim 1, wherein said tunneling barriers in the conductive carrier storage part are made of Si thin film, and said at least one storage region and low barrier region in the conductive carrier storage part are made of SiGe thin film.

24. A semiconductor device as set forth in claim 1, wherein said tunneling barriers in the conductive carrier storage part are made of a thin film of monocrystalline semiconductor, and said at least one storage region and low barrier region in the conductive carrier storage part are made of a thin film of any materials which have the substantially same lattice constant as that on the surface of the monocrystalline semiconductor.

* * * * *

UNITED STATES PATENT AND TRADEMARK OFFICE
CERTIFICATE OF CORRECTION

PATENT NO. :   5,604,357
DATED       :   February 18, 1997
INVENTOR(S) :   Takashi HORI It is certified that error appears in the above-identified patent and that said Letters Patent is hereby corrected as shown below:

Col. 31, line 41:   Replace "are" with --is--

Col. 31, line 42:   Replace "the" with --a--(first occurrence)

Col. 32, line 26:   Replace "dielectric" with --insulator--

Signed and Sealed this

Twenty-second Day of September, 1998

Attest:

BRUCE LEHMAN

*Attesting Officer*     *Commissioner of Patents and Trademarks*